(12) United States Patent
Wu et al.

(10) Patent No.: US 10,171,204 B2
(45) Date of Patent: Jan. 1, 2019

(54) CODED BIT PUNCTURING FOR POLAR CODES

(71) Applicant: MEDIATEK INC., Hsin-Chu (TW)

(72) Inventors: Wei-De Wu, Hsinchu (TW); Mao-Ching Chiu, Minxiong Township (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 15/595,189

(22) Filed: May 15, 2017

(65) Prior Publication Data

US 2017/0331590 A1     Nov. 16, 2017

Related U.S. Application Data

(60) Provisional application No. 62/455,054, filed on Feb. 6, 2017, provisional application No. 62/335,858, filed on May 13, 2016.

(51) Int. Cl.
*H03M 13/00* (2006.01)
*H04L 1/00* (2006.01)
(Continued)

(52) U.S. Cl.
CPC ........ *H04L 1/0058* (2013.01); *H03M 13/005* (2013.01); *H03M 13/2792* (2013.01);
(Continued)

(58) Field of Classification Search
CPC ... H04L 1/0058; H04L 1/1819; H04L 1/0041; H04L 1/0068; H03M 13/005; H03M 13/2792; H03M 13/6362; H03M 13/13
See application file for complete search history.

(56) References Cited

U.S. PATENT DOCUMENTS

2009/0067543 A1\* 3/2009 Hsiao ................... H04B 7/0617
375/298
2014/0208183 A1   7/2014 Mahdavifar et al.
(Continued)

FOREIGN PATENT DOCUMENTS

CN     102122966 A     7/2011
EP     2 722 993 A1    4/2014

OTHER PUBLICATIONS

Extended Search Report dated Oct. 19, 2017 in European Patent Application No. 17171096.5.
(Continued)

*Primary Examiner* — Jean B Corrielus
(74) *Attorney, Agent, or Firm* — Oblon, McClelland, Maier & Neustadt, L.L.P.

(57) ABSTRACT

Aspects of the disclosure provide a method for polar code puncturing. The method can include receiving a mother polar code including a sequence of coded bits, the sequence of coded bits having indices $\{0, \ldots, N-1\}$ and including at least a first block of coded bits having indices $\{0, \ldots, i-1\}$, a second block of coded bits having indices $\{i, \ldots, i+k-1\}$, a third block of coded bits having indices $\{i+k, \ldots, i+k+k-1\}$, interleaving the second block of coded bits with the third block of coded bits to form a rearranged sequence of coded bits including the N coded bits, and extracting the last M coded bits from the rearranged sequence of coded bits to generate a punctured code having a length of M.

20 Claims, 14 Drawing Sheets

(51) Int. Cl.
  *H03M 13/27* (2006.01)
  *H04L 1/18* (2006.01)
  *H03M 13/13* (2006.01)

(52) U.S. Cl.
  CPC ...... *H03M 13/6362* (2013.01); *H04L 1/0041* (2013.01); *H04L 1/0068* (2013.01); *H04L 1/1819* (2013.01); *H03M 13/13* (2013.01)

(56) References Cited

U.S. PATENT DOCUMENTS

| | | | |
|---|---|---|---|
| 2015/0077277 A1 | 3/2015 | Alhussien et al. | |
| 2015/0236715 A1* | 8/2015 | Alhussien | H03M 7/40 341/67 |
| 2015/0333769 A1 | 11/2015 | Jeong et al. | |
| 2016/0269050 A1 | 9/2016 | Shen et al. | |
| 2016/0285479 A1* | 9/2016 | El-Khamy | H03M 13/6368 |
| 2016/0380763 A1 | 12/2016 | Ahn et al. | |
| 2017/0230063 A1* | 8/2017 | Jeong | H03M 13/2792 |
| 2017/0250779 A1* | 8/2017 | Murakami | H04L 1/0004 |

OTHER PUBLICATIONS

Extended European Search Report dated Nov. 27, 2017 in Patent Application No. 17182093.9.
"Polar Code Size and Rate-Matching Design for NR Control Channels", MediaTek, Inc., 3GPP TSG RAN WG1 RAN1 #88 Meeting, R1-1702735, XP051221575, Feb. 2017, 8 pages.
"Polar Codes Contruction and Rate Matching Scheme", ZTE, 3GPP TSG RAN WG1 Meeting #89, R1-1707183, XP051262938, May 2017, 13 pages.
Valerio Bioglio, et al., "Low-Complexity Puncturing and Shortening of Polar Codes", Arxiv.org, Cornell University Library, XP080750896, 2017, 6 pages.
"Polar Code Design Features for Control Channels", MediaTek, Inc., 3GPP TSG RAN WG1 AH_NR Meeting, R1-1700168, XP051207710, 2017, 8 pages.
Notification of Transmittal of the International Search Report and Written Opinion in PCT/CN2018/075465 dated May 21, 2018 citing AA-AC and AO therein, 10 pages.

* cited by examiner

CODED BIT PUNCTURING FOR POLAR CODES

INCORPORATION BY REFERENCE

This present disclosure claims the benefit of U.S. Provisional Application No. 62/335,858, "Rate Matching Design for Polar Codes" filed on May 13, 2016, and U.S. Provisional Application No. 62/455,054, "Unified Polar Code Rate-Matching Design" filed on Feb. 6, 2017, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Polar codes are a class of error correcting codes, and can be employed to achieve the capacity of various communication channels. Construction of polar codes relies on a specific recursive encoding procedure. The recursive encoding procedure synthesizes a set of virtual channels from a plurality of usages of a transmission channel. The synthesized virtual channels tend to become either noiseless or completely noisy when the code length goes to infinity. This phenomenon is known as channel polarization. In their original construction, polar codes only allow code lengths that are powers of two. Puncturing techniques can be employed to modify polar codes in order to achieve any code length. In puncturing, one or more coded bits are selected and not transmitted.

SUMMARY

Aspects of the disclosure provide a method for polar code puncturing. The method can include receiving a mother polar code including a sequence of coded bits, the sequence of coded bits having indices $\{0, \ldots, N-1\}$ and including at least a first block of coded bits having indices $\{0, \ldots, i-1\}$, a second block of coded bits having indices $\{i, \ldots, i+k-1\}$, a third block of coded bits having indices $\{i+k, \ldots, i+k+k-1\}$, interleaving the second block of coded bits with the third block of coded bits to form a rearranged sequence of coded bits including the N coded bits, and extracting the last M coded bits from the rearranged sequence of coded bits to generate a punctured code having a length of M.

In an embodiment, $i=N/4$, and $i+k=N/2$. In one example, the mother polar code is generated based on a generator matrix $G_N$ having a form of $G_N = F^{\otimes r}$, where $F^{\otimes r}$ denotes an n-th Kronecher product of a basis matrix $$F = \begin{bmatrix} 1 & 0 \\ 1 & 1 \end{bmatrix}.$$

An embodiment of the method can further include receiving a polar code generated based on a generator matrix $G_N$ having a form of $G_N = B_N F^{\otimes r}$, wherein $B_N$ denotes a bit-reversal permutation matrix, and $F^{\otimes n}$ denotes an n-th Kronecher product of a basis matrix $$F = \begin{bmatrix} 1 & 0 \\ 1 & 1 \end{bmatrix},$$

and performing a bit-reversal permutation to the received polar code to generate the mother polar code. Another embodiment of the method can further include storing the rearranged sequence of coded bits in a buffer. Accordingly, the last M coded bits of the rearranged sequence of coded bits can be read from the buffer to generate the punctured code.

Aspects of the disclosure provide an apparatus for polar code puncturing. The apparatus can include an interleaving circuit and a bit selector circuit. The interleaving circuit can be configured to receive a mother polar code including a sequence of coded bits, the sequence of coded bits having indices $\{0, \ldots, N-1\}$ and including at least a first block of coded bits having indices $\{0, \ldots, i-1\}$, a second block of coded bits having indices $\{i, \ldots, i+k-1\}$, a third block of coded bits having indices $\{i+k, \ldots, i+k+k-1\}$, and interleave the second block of coded bits with the third block of coded bits to form a rearranged sequence of coded bits including the N coded bits. The bit selector circuit can be configured to extract the last M coded bits from the rearranged sequence of coded bits to generate a punctured code having a length of M.

Aspects of the disclosure provide a second method for polar code puncturing. The method can include receiving a mother polar code including a sequence of coded bits generated from a polar encoder that encodes a sequence of input bits having indices $\{0, \ldots, N-1\}$ to generate the mother polar code according to a polar graph, wherein the mother polar code has a length of N, and N is 2 to the n-th power, and generating a punctured code including the sequence of coded bits excluding P number of punctured coded bits, wherein $P=2^q+p$, $q \leq n-2$, q is the largest exponent so that $0 \leq p \leq 2^q-1$. A first portion of the punctured coded bits can include coded bits in the polar graph directly connected to input bits having indices included in an index set $A=\{0, \ldots, 2^q-1\}$.

Aspects of the disclosure provide a second apparatus for polar code puncturing. The apparatus can include a bit selector circuit. The bit selector circuit can be configured to receive a mother polar code including a sequence of coded bits generated from a polar encoder that encodes a sequence of input bits having indices $\{0, 1 \ldots, N-1\}$ to generate the mother polar code according to a polar graph, wherein the mother polar code has a length of N, and N is 2 to the n-th power. The bit selector can be further configured to generate a punctured code including the sequence of coded bits excluding P number of punctured coded bits, wherein $P=2^q+p$, $q \leq n-2$, q is the largest exponent so that $0 \leq p \leq 2^q-1$. A first portion of the punctured coded bits includes coded bits in the polar graph directly connected to input bits having indices included in an index set $A=\{0, \ldots, 2^q-1\}$.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
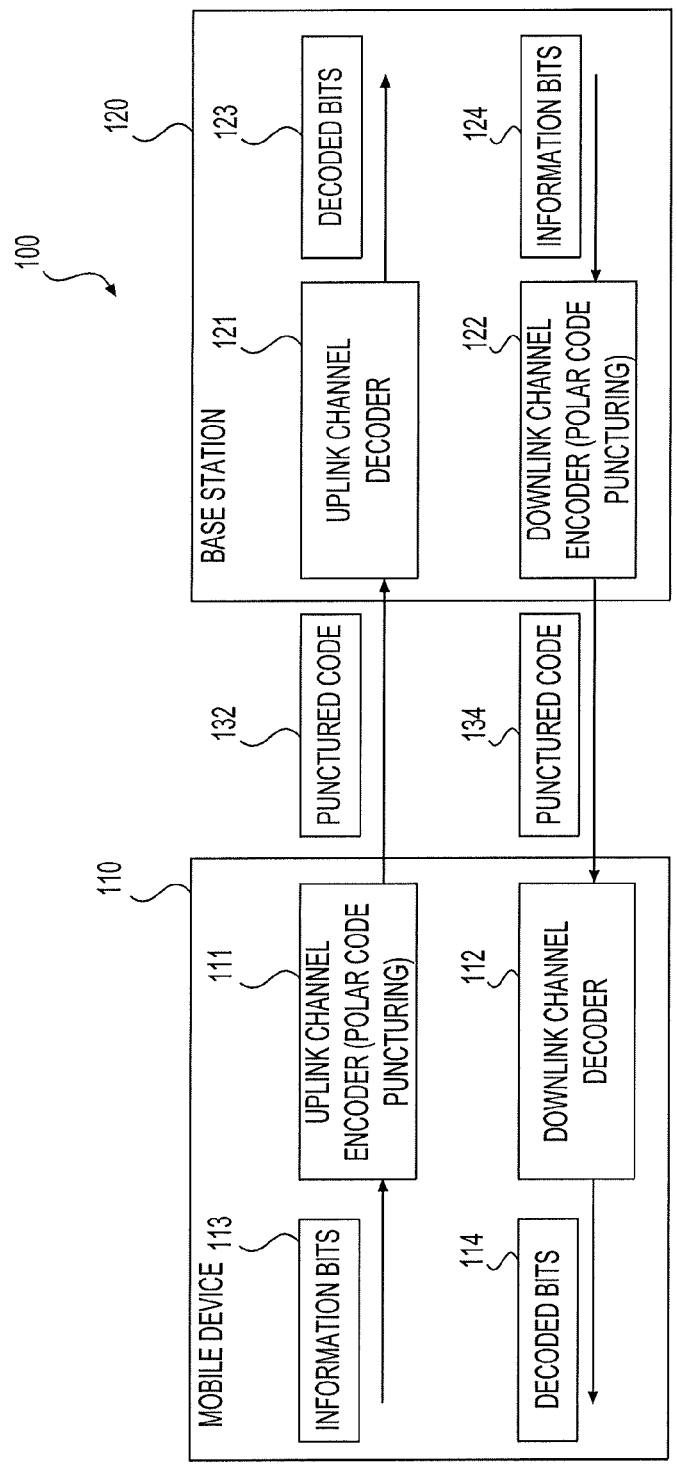
FIG. 1 shows a wireless communication system according to an embodiment of the disclosure.

FIG. 1 shows a wireless communication system 100 according to an embodiment of the disclosure. The wireless communication system 100 includes a mobile device 110 and a base station 120. The mobile device 110 includes an uplink (UL) channel encoder 111 and a downlink (DL) channel decoder 112. The base station 120 includes an UL channel decoder 121 and a DL channel encoder 122. Those components are coupled together as shown in FIG. 1.

In one example, the wireless communication system 100 is a mobile communication network compliant with one of various wireless communication standards, for example, developed by the 3rd Generation Partnership Project (3GPP). The mobile device 110 can be a mobile phone, a lap top computer, a tablet computer, and the like. The base station 120 can include one or more antennas. The antennas can be employed to receive or transmit wireless signals to communicate with a plurality of mobile devices including the mobile device 110. Accordingly, the based station 120 can receive data from the mobile device 110 and transfer the data to another mobile device or another communication network, or vice versa.

In one example, the UL channel encoder 111 at the mobile device 110 is configured to perform channel coding with polar codes for transmission of control information from the mobile device 110 to the base station 120. The control information can be uplink control information generated at a physical layer or an upper layer of a protocol stack of the mobile device 110. As a result, blocks of uplink control information are each encoded into a polar code. In addition, the UL channel encoder 111 is configured to employ polar code puncturing techniques described in this disclosure to adjust lengths of the polar codes in order to match coded bits with allocated transmission resources. As an example, the transmission resources can be resource elements in a time-frequency resource grid of an orthogonal frequency division multiplexing (OFDM) modulation system. The UL channel decoder 121 at the base station 120 is configured to perform channel decoding as a counterpart of the UL channel encoder 111.

In operation, the mobile device 110 generates control information, such as the uplink control information, and performs a channel coding process for transmission of the control information. During the channel coding process, a block of information bits 113 of the control information can be received at the UL channel encoder 111. The UL channel encoder 111 can then employ a polar encoder to encode the block of information bits 113 into a polar code. Subsequently, the UL channel encoder 111 can employ the polar code puncturing techniques to extract a certain number of coded bits from the polar code according to allocated transmission resources. A punctured code 132 resulting from the puncturing operation can then be obtained and transmitted to the base station 120. At the UL channel decoder 121, the punctured code 132 can be received and processed, and decoded bits 123 corresponding to the information bits 113 can accordingly be generated.

The DL channel encoder 122 at the base station 120 and the DL channel decoder 112 at the mobile device 110 have similar functions and structures as the UL channel encoder 111 and the DL channel decoder 121, respectively, however, operating in an opposite direction. In operation, a block of information bits 124 can be generated at the base station 120 and encoded into a polar code at the DL channel encoder 122. After a polar code puncturing operation, a punctured code 134 can be extracted from the polar code. The punctured code 134 can then be received and processed at the DL channel decoder 112. Accordingly, decoded bits 114 corresponding to the information bits 124 can be obtained.

Figure 2:
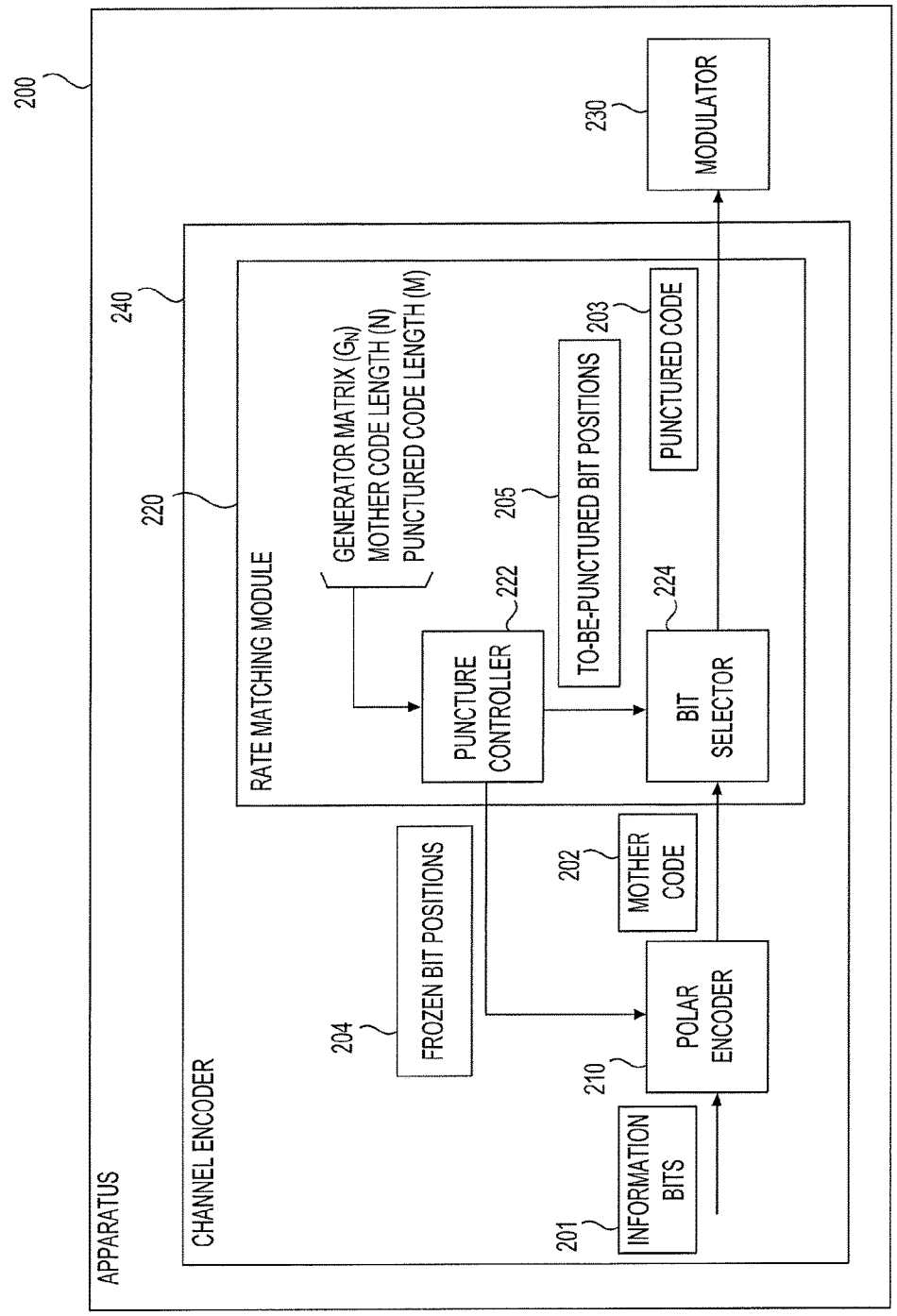
FIG. 2 shows an apparatus for rate matching according to an embodiment of the disclosure.

FIG. 2 shows an apparatus 200 for rate matching according to an embodiment of the disclosure. The apparatus 200 employs the polar code puncturing techniques to modify polar codes to generate punctured codes in order to match coded bits with allocated transmission resources. Functions and processes described with reference to the apparatus 200 can be utilized in the mobile device 110 or the base station 120 in the FIG. 1 example for transmission of uplink or downlink control information. In one example, the apparatus 200 includes a channel encoder 240 and a modulator 230. The channel encoder 240 includes a polar encoder 210 and a rate matching module 220. The rate matching module 220 includes a puncture controller 222 and a bit selector 224. Those components are coupled together as shown in FIG. 2.

The apparatus 200 can be a mobile device, or a base station. The apparatus 200 can be configured to transmit data to a remote device, such as a mobile device or base station, through a wireless channel. The channel encoder 240 is configured to perform a channel coding process to encode to-be-transmitted data. The modulator 230 is configured to further process the encoded data to generate modulated signals. For example, interleaving, quadrature amplitude modulation (QAM) or quadrature phase shift keying (QPSK) modulation, antenna mapping, transmission resource mapping, and the like, can be performed at the modulator 230. The modulated signal can subsequently be transmitted to a remote device.

In one example, the polar encoder 210 is configured to encode information bits 201 into polar codes. Generally, polar codes can be constructed based on a specific recursive encoding procedure. During the recursive encoding procedures, a set of N virtual channels can be synthesized from N usages of a transmission channel W, where N denotes the code length of the polar codes. A successive cancellation (SC) decoder, for example, can be employed to reverse the recursive encoding procedure at a receiver end. When the code length N becomes larger, due to the channel polarization effect, a part of the bit channels becomes better with a gradually increased reliability, while the other part of the bit channels becomes worse with a gradually decreased reliability. The former bit channels can be referred to as good channels, while the latter bit channels can be referred to as bad channels. In one example, the polar encoder 210 uses a polar code length of N=1024 bits for encoding UL control information and a polar code length of N=512 bits for encoding DL control information.

Accordingly, an encoding strategy is to transmit information bits over the good channels while assigning fixed bit (referred to as frozen bits) to the bad channels. Specifically, in one example, reliabilities of the number of N bit channels can be calculated based on a channel condition of the transmission channel W. Based on the calculated reliabilities, the most reliable bit channels can be used for transmission of information bits while the least reliable bit channels can be set to a fixed value, for example, zero.

A polar code can be obtained by applying a linear transformation on a data vector (input bits vector) that contains both information bits and frozen bits. Specifically, the transformation can be represented as the following expression, $$x_0^{N-1} = u_0^{N-1} G_N = u_0^{N-1} B_N F^{\otimes n} \quad (1),$$

where $x_0^{N-1}$ denotes a polar code vector, $u_0^{N-1}$ denotes an input bits vector, $B_N$ denotes a bit-reversal permutation matrix, $\otimes$ denotes a Kronecker product, $F^{\otimes n}$ denotes n-th Kronecher product of a basis matrix $$F = \begin{bmatrix} 1 & 0 \\ 1 & 1 \end{bmatrix},$$

N denotes the polar code length which is a power of 2, and $n = \log_2 N$. In addition, $G_N$ is a square matrix and represents a generator matrix of the polar codes.

The input bits vector $u_0^{N-1} = (u_0, u_1, \ldots, u_{N-1})$ can include N input bits each having an index from 0 to N−1, referred to as an input bit index. With respect to the generator matrix $G_N$, each input bit and the respective input bit index correspond to a row in the generator matrix $G_N$. In addition, each bit channel or synthesized channel corresponds to a row in the generator matrix $G_N$. Accordingly, each input bit corresponds to a bit channel. Thus, the input bit indices are also used for indexing the bit channels and the rows in the generator matrix in this detailed description.

In an example, a polar code has a codeword length of N=8. The input bits vector is $u_0^7 = (u_0, u_1, \ldots, u_7)$. The input bits includes information bits with a length of K=4, and frozen bits with a length of F=4. Indices of the information bits are included in an information bits index set, {3, 5, 6, 7}, while indices of the frozen bits are included in a frozen bits index set, {0, 1, 2, 4}. Assuming the information bits set are {i1, i2, i3, i4}, and the frozen bits are set to 0, the input bits can accordingly be represented as follows, $$u_0^7 = (u_0, u_1, \ldots, u_7) = (0, 0, 0, i1, 0, i2, i3, i4).$$

At the polar encoder 210, positions for information bits and frozen bits among the input bits positions can first be determined. For example, reliabilities of bit channels for the polar encoding process can first be determined. The reliabilities can be calculated on line based on an estimated channel condition. Alternatively, reliabilities can be calculated off line for different channel conditions and stored in a memory, and retrieved according to a current estimated channel condition. In addition, the polar encoder 210 can receive a P number of frozen bit positions 204 determined at the rate matching module 220. Each of the received frozen bit positions can correspond to a punctured coded bit.

Assume the input bits length (the polar code length) for the polar coding is N corresponding to N input bits positions, and information bits length is K. Accordingly, the polar encoder 210 can then exclude the P frozen bit positions from the N input bits positions. Subsequently, the polar encoder 210 can select K positions among the left N-P input bits positions for information bits. The selected K positions correspond to bit channels having the highest reliabilities among bit channels corresponding to the left N-P input bits positions. Finally, the left N-P-K input bits positions can be determined to be the fixed bits position.

Based on the determined information bits and frozen bits positions, the polar encoder 210 can map the information bits to the input vector of the polar encoder 210. Subsequently, the input vector can be encoded into a polar code 202 based on a generator matrix $G_N$. The polar code 202 has a length of N, and is later punctured at the rate matching module 220. Accordingly, the polar code 202 is referred to as a mother polar code or a mother code 202, and a code generated from the mother code 202 after the puncturing operation is referred to as a punctured code. The code length N of the mode code 202 is referred to as a mother code length.

The rate matching module 220 receives the mother code 202 and performs a puncturing process to generate a punctured code 203. The puncture controller 222 is configured to determine to-be-punctured bit positions 205 in the mother code 202. In one example, the determination process is based on the generator matrix $G_N$, the mother code length N, and a punctured code length M. In one example, the punctured code length M is determined at a component in the apparatus 200, for example, according to a channel condition of the transmission channel or allocation of transmission resources. In addition, the puncture controller 222 is also configured to determine the frozen bit positions 204. For polar codes, puncturing operations can affect reliabilities of bit channels. When an output bit in the mother code 202 is punctured, a bit channel associated with the punctured output bit becomes a bad channel. An input bit corresponding to this bad channel cannot be decoded at the receiver side. Thus, the input bit can be determined to be a frozen bit among input bits.

The bit selector 224 is configured to receive the mother code 202 and extract un-punctured bits from the mother code 202 to form the punctured code 203. The extraction can be based on information of to-be-punctured bit positions 205 received from the puncture controller 222. In one example, the to-be-punctured bit position information is represented as a puncture pattern. The puncture pattern can be expressed by a binary vector. For example, zeros in the puncture pattern vector can represent punctured bits positions, while ones can represent un-punctured bits positions. Further details of functions and structures of the rate matching module 220 are described below.

While the rate matching module 220 in FIG. 2 example employs a puncturing scheme to realize rate matching functionality, it is to be understood that, in other examples, the rate matching module 220 can employ more than one rate matching schemes to optimize its rate matching performance. For example, the rate matching module 220 can select one rate matching scheme from multiple rate matching schemes, such as puncturing, shortening, repetition, and the like. The selection can be based on some conditions, such as whether mother code rate, defined as a ratio of information bits length to a polar code length, is larger than a threshold, whether the mother code length is larger than a code length required by a transmission resource allocation, and the like. Corresponding to different scenarios, different rate matching schemes can be selected to achieve an optimal rate matching performance.

Figure 3A:
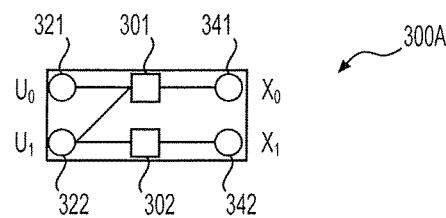
FIGS. 3A-3C show a recursive construction process for constructing a polar graph according to an embodiment of the disclosure.
Figure 3B:
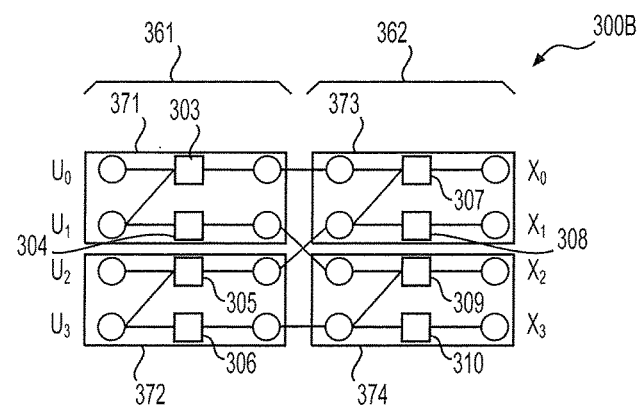
Figure 3C:
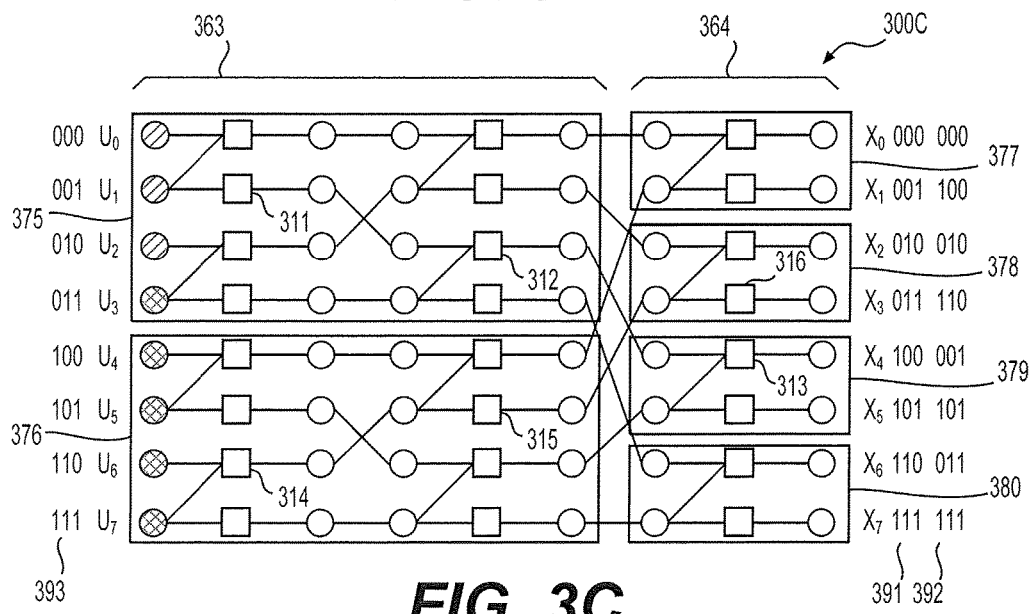

FIGS. 3A-3C show a recursive construction process for constructing a polar graph 300C according to an embodiment of the disclosure. The constructed polar graph 300C corresponds to the generator matrix $G_N = B_N F^{\otimes r}$ in the expression (1) where N=8. A polar graph constructed according to a generator matrix can be used as a tool for analysis of encoding and puncturing processes conducted based on the generator matrix. FIG. 3A shows a first polar graph 300A corresponding to $$G_2 = B_2 F^{\otimes 1} = \begin{bmatrix} 1 & 0 \\ 1 & 1 \end{bmatrix}.$$

The polar graph 300A includes two input bits u0 and u1, represented by two circle 321-322, and two output bits x0 and x1, represented by two circles 341-342. The polar graph 300A illustrates an encoding process represented by the following expression, $$[x0 \ x1] = [u0 \ u1]\begin{bmatrix} 1 & 0 \\ 1 & 1 \end{bmatrix}.$$

At the same time, the polar graph 300A can illustrate a channel polarization process. Specifically, squares 301 and 302 can represent two virtual bit channels, an upper channel 301 and a lower channel 302, corresponding to the encoding process. The input bit u0 is transmitted through the upper channel 301; however, the transmission of u0 is interfered by the input bit u1. Accordingly, reliability of the upper channel 301 for transmission of the input bit u0 is decreased. In contrast, the input bit u1 is transmitted via the lower channel 302, however, the transmission of u1 is assisted by the upper channel 301 because part of u1 is transmitted via the upper channel 301. As a result, the upper channel 301 is degraded while the lower channel 302 is enhanced.

FIG. 3B shows a second polar graph 300B corresponding to $$G_4 = B_4 F^{\otimes 2} = \begin{bmatrix} 1 & 0 & 0 & 0 \\ 1 & 0 & 1 & 0 \\ 1 & 1 & 0 & 0 \\ 1 & 1 & 1 & 1 \end{bmatrix}.$$

The polar graph 300B includes four input bits u0-u3, and four output bits x0-x3. The polar graph 300B illustrates an encoding process represented by the following expression, $$[x0 \ x1 \ x2 \ x3] = [u0 \ u1 \ u2 \ u3]\begin{bmatrix} 1 & 0 & 0 & 0 \\ 1 & 0 & 1 & 0 \\ 1 & 1 & 0 & 0 \\ 1 & 1 & 1 & 1 \end{bmatrix}.$$

As shown, the polar graph 300B uses the polar graph 300A as a building block for constructing the polar graph 300B. The polar graph 300B includes a first stage 361 and a second stage 362. Each stage 361-362 includes an upper block 371 or 373 and a lower block 372 or 374, respectively. The first stage upper block 371 uses upper channels of the second stage 362, while the first stage lower block 372 uses lower channels of the second stage 362. Thus, four bit channels are formed by the flowing four pairs of sub-bit channels shown in FIG. 300B: a first bit channel 303-307, a second bit channel 304-309, a third bit channel 305-308, and a fourth bit channel 306-310. Among the four bit channels, the bit channel of 303-307 is the noisiest because the two bit channels 303 and 307 are worse bit channels in the respective blocks 371 or 373, while the bit channel of 306-310 is the most reliable because the two bit channels 306 and 310 are better bit channels in the respective blocks 372 or 374. Reliabilities of the other two bit channels, 304-309 and 305-308 are between that of the two bit channels, 303-307 and 306-310.

FIG. 3C shows a third polar graph 300C corresponding to a polar code generator matrix $G_8 = B_8 F^{\otimes 3}$. The polar graph 300C includes eight input bits u0-u7 and eight output bits x0-x7. Similarly, the polar graph 300C illustrates an encoding process corresponding to the generator $G_8$. As shown, the polar graph 300C uses the polar graphs 300A and 300B as building blocks for constructing the polar graph 300C. Similarly, the polar graph 300C includes a first stage 363 and a second stage 364. The stage 363 includes an upper block 375 and a lower block 376, while the stage 364 includes four blocks 377-380. The first stage upper block 375 uses upper channels of the second stage 364, while the first stage lower block 376 uses lower channels of the second stage 364.

Based on the above construction, eight bit channels are formed. For example, one of the eight bit channels is formed by concatenating three sub-bit channels 311, 312 and 313. Another one of the eight bit channels is formed by concatenating three sub-bit channels 314, 315 and 316. Each of the eight bit channels initiates from an input bit and ends at an output bit. Accordingly, an input bit associated with the respective bit channel is used for referring the respective bit channel. For example, the bit channel of 311-312-313 starts from the input bits u1, thus is referred to as bit channel u1.

When an output bit is connected with an input bit through one of the eight bit channels u0-u7, it is said the output bit is directly connected to the respective input bits. For example, the output bit x4 is directly connected to the input bit u1, while the output bit x3 is directly connected to the input bit u6. In addition, as shown in FIG. 3C, a bit-reversed index of an output bit is the index of an input bit that is directly connected to this output bit. Specifically, binary indices of the output bits x0-x7 are shown in column 391, bit-reversed indices of the output bits x0-x7 are shown in column 392, and binary indices of the input bits u0-u7 are shown in column 393. As an example, the output bit x4 has a binary index 100. The bit-reversed index of the output bit x4 is 001 which is the index of the input bit u1. The input bit u1 is directly connected to the output bit x4 via the bit channel u1. Accordingly, given an input bit, by performing a bit-reversal operation on the index of this input bit, an index of an output bit directly connected to this input bit can be determined.

The bit channels u0-u7 have polarized properties due to the polarization effect. Generally, for a given channel condition for transmitting the polar codes constructed based on a polar graph, upper bit channels associated with input bits near the top of the polar graph have worse reliabilities while lower bit channels associated with input bits near the bottom of the polar graph have better reliabilities. The lower bit channels' positions in the polar graph, the better the reliabilities of those bit channels. Thus, the lower input bits are preferred to be used as information bits while the upper input bits are used as frozen bits. An input bit used as an information bit is referred to as a good bit while an input bit used as a frozen bit is referred to as a bad bit. As an example, in FIG. 3C, good bits are shown with circles shaded with cross lines, while bad bits are shown with circles shaded with up-ward diagonal lines.

Figure 4:
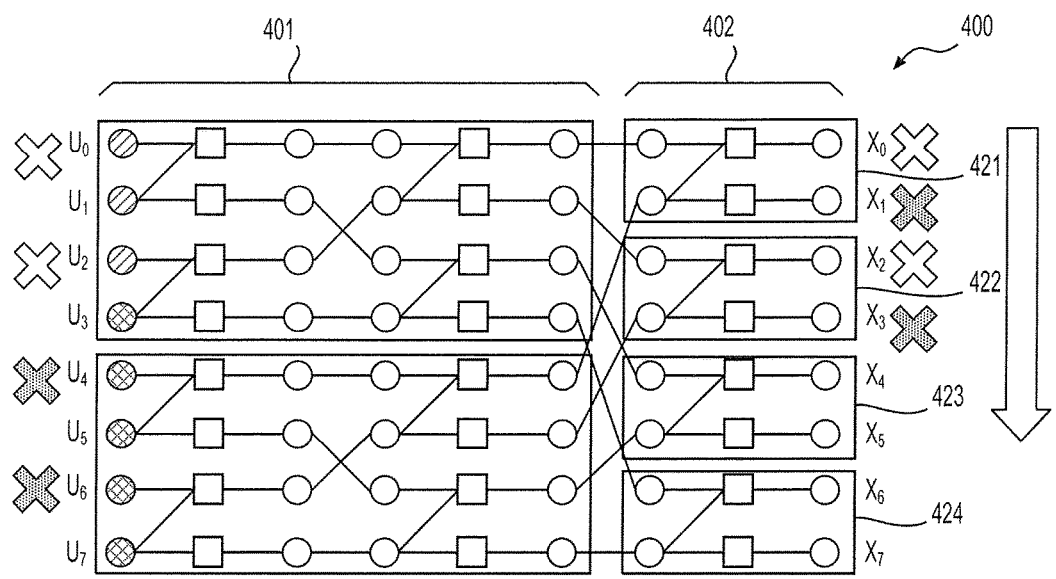
FIG. 4 shows a polar graph illustrating a first conventional puncturing strategy.

FIG. 4 shows a polar graph 400 illustrating a first conventional puncturing strategy. The polar graph 400 is similar to the polar graph 300C in FIG. 3C. The polar graph 400 includes a first stage 401 and a second stage 402. The second stage 402 includes a sequence of output blocks 421-424. The polar graph 400 includes eight input bits u0-u7, and eight output bits x0-x7. Eight bit channels u0-u7 connect the eight pairs of input bits and output bits, respectively. The first conventional puncturing strategy is to puncture output bits at upper output blocks first. For example, for different length of to-be-punctured bits, P, the output bits are punctured in a top-down order from the top bits x0 until the P-th output bits.

This first conventional puncturing strategy confines the puncturing impact to upper channels at the input side of the first stage blocks. As shown, in one example, the to-be-punctured bit length P equals 4, and accordingly the output bits x0-x3 are selected and punctured. As a result, the input bits u0, u2, u4, and u6, which are directly connected to the punctured output bits x0, x2, x1 and x3, respectively, through the bit channels u0, u2, u4, and u6, are impacted. Specifically, because the punctured bits are not transmitted, the bit channels corresponding to the punctured bits become unusable. Consequently, the input bits u0, u2, u4, and u6 cannot be decoded and are used as frozen bits.

Disadvantage of the first conventional puncturing strategy is that good bits, such as input bits u4 and u6, are dropped even with low to medium puncturing ratios. A puncturing ratio is defined as the ratio of a punctured bits length to a mother polar code length. When a transmission channel for transmission of polar codes has a low signal-to-noise ratio (SNR), a low code rate (the ratio between input bits length and punctured code length) can be adopted. For example, the low code rate adopted can be 1/5, 1/3, or 2/5. In this scenario, a number of information bits is relative fewer than with a high code rate, and good bit channels become critical for reliable transmission of the information bits. Therefore, performance of this first conventional puncturing strategy may suffer from early good bit loss leading to inferior performance for low code rate transmission.

Figure 5:
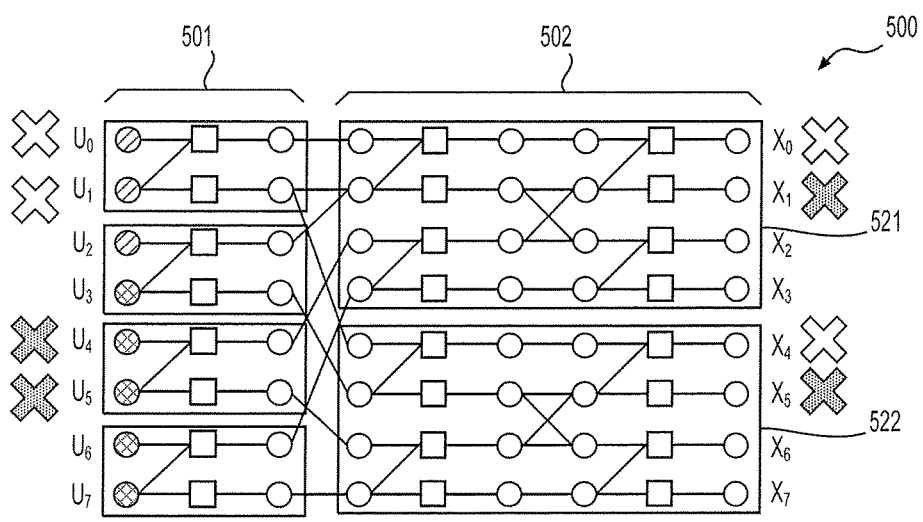
FIG. 5 shows a polar graph illustrating a second conventional puncturing strategy.

FIG. 5 shows a polar graph 500 illustrating a second conventional puncturing strategy. The polar graph 500 is equivalent to the polar graph 300C in FIG. 3C in terms of property of polar codes constructed from the polar graphs 500 or 300C. For example, a bit-reversed index of an output bit would be an index of an input bit that is directly connected to the output bit through a bit channel. The polar graph 500 includes a first stage 501 and a second stage 502. The second stage 502 includes two output blocks 521-522.

The polar graph 500 includes eight input bits u0-u7, and eight output bits x0-x7. Eight bit channels u0-u7 connect the eight pairs of input bits and output bits, respectively. As shown, the second conventional puncturing strategy is to first puncture from upper output bits of each output blocks 521-522 of the second stage 502 and go down to lower output bits of each output blocks 521-522 until reaching the length of to-be-punctured bits. Accordingly, input bits positions mirroring positions of the punctured output bits are impacted by the puncturing operation. For example, when the output bits x0, x1, x4, and x5 are punctured, the input bits u0, u1, u4 and u5 are impacted.

Compared with the first conventional puncturing strategy, the second conventional puncturing strategy preserves good bits close to the bottom of the polar graph. However, for a high code rate adapted for a transmission channel with a higher SNR, such as a code rate 5/6 or 8/9, puncturing of good bits, such as input bits u4-u5, degrades the coding performance of the second conventional puncturing strategy.

Figure 6:
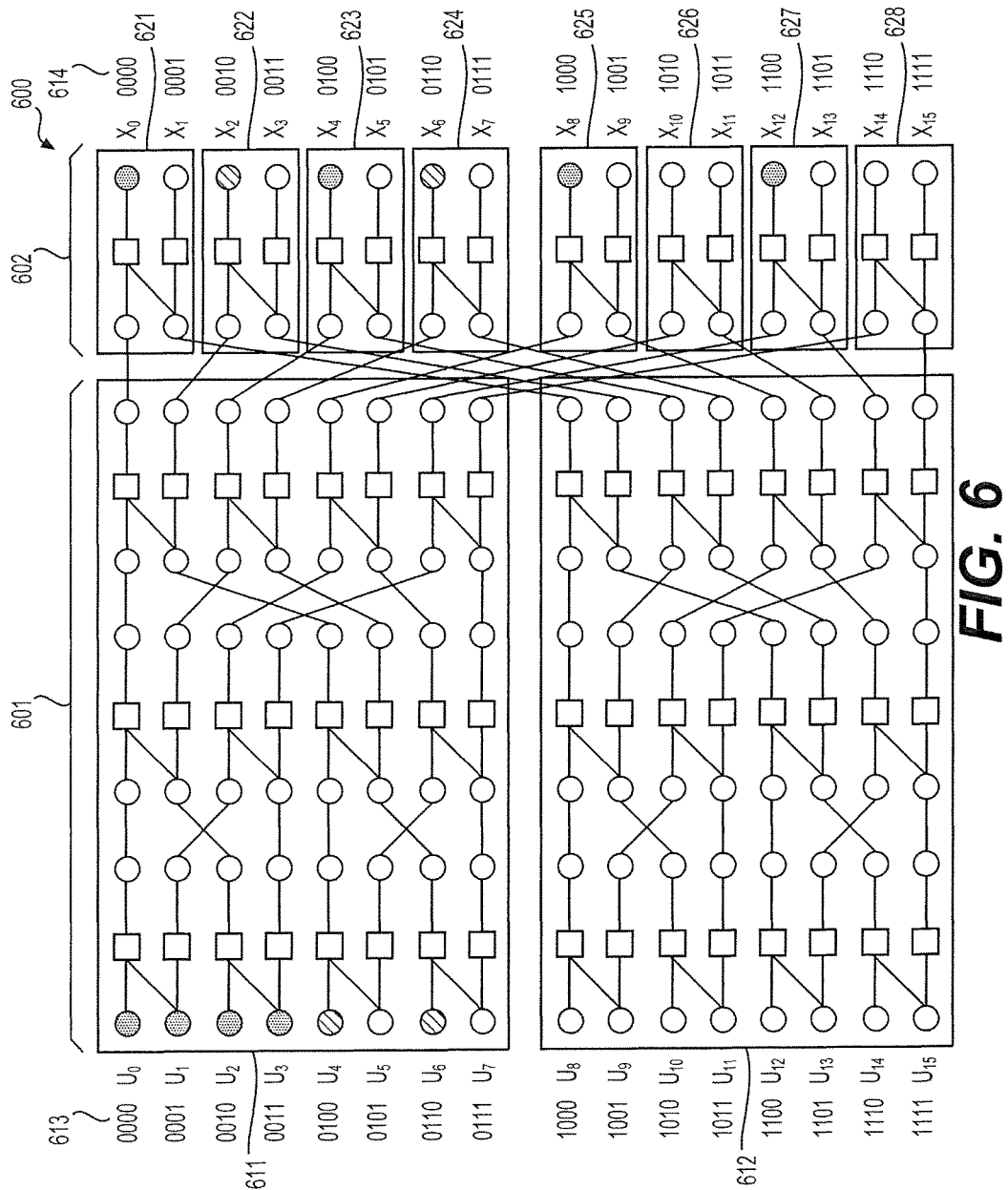
FIG. 6 shows a polar graph illustrating an example of a first polar code puncturing technique according to an embodiment of the disclosure.

FIG. 6 shows a polar graph 600 illustrating an example of a first polar code puncturing technique according to an embodiment of the disclosure. The polar graph 600 can be created based on a polar code generator matrix $G_{16}=B_{16}F^{\otimes 4}$. A mother polar code length corresponding to the polar graph 600 is 16. The polar graph 600 includes sixteen input bits u0-u15 and sixteen output bits x0-x15. The polar graph 600 includes an input stage 601 and an output stage 602. The input stage 601 includes two input blocks 611-612. The output stage 602 includes a sequence of output blocks 621-628. In addition, FIG. 6 also shows binary indices 613 of the input bits besides the input bits and binary indices 614 of the output bits beside the output bits. The binary indices each include n=4 bits corresponding to the mother polar code length $16=2^4$.

According to an aspect of the disclosure, a strategy for the first puncturing technique is to consider impacts at both input bit side and output bit side when selecting to-be-punched bit channels. A bit channel connected to a to-be-punctured output bit is referred to as a to-be-punctured bit channel, and an input bit connected to a to-be-punctured bit channel is referred to as a to-be-punctured input bit. Thus, the strategy of the first puncturing technique can include: at the output bit side, preferably selecting to-be-punctured output bits that are positioned at upper channels of upper output blocks, while at the input bit side, preferably selecting upper input bits as to-be-punctured input bits.

In one example, a mother polar code length is $N=2^n$, and a to-be-punctured bits length is P. P can be expressed in the following form, $$P=2^q+p,$$

where $q<=n-2$, and q is the largest exponent so that $0<=p<=2^q-1$. For example, for P=13, P can be expressed as $P=2^3+5$, where q=3 and p=5. Accordingly, based on the strategy of the first puncturing technique, a puncturing process implementing the first polar code puncturing technique can include the following steps:

At a first step, a first portion of $2^q$ to-be-punctured output bits can be determined. Specifically, the $2^q$ to-be-punctured output bits can be selected to be the output bits directly connected to the input bits having indices included in the input bit index set $A=\{0, \ldots, 2^q-1\}$. An example is shown in FIG. 6 where N=16, n=4, and P=6, and P can be expressed as $P=2^2+2$. Accordingly, q=2, and p=2. A number of the first portion of $2^q$ to-be-punctured output bits is 4. Accordingly, the input bit index set A can be determined to be $\{0, 1, 2, 3\}$, or $\{0000, 0001, 0010, 0011\}$, in n-bit binary form for n=4.

The input bits corresponding to the index set A are u0-u3. Indices of output bits directly connected to the input bits u0-u3 can be determined by bit-reversing the binary indices of the index set A. For example, by bit-reversing the input bit index set A={0000, 0001, 0010, 0011}, the indices of the respective output bits are obtained as {0000, 1000, 0100, 1100}. Accordingly, the to-be-puncture output bits can be determined to be x0, x8, x4, and x12, respectively.

At a second step, a second portion of the remaining p to-be-punctured output bits can be determined. Specifically, the p to-be-punctured output bits can be selected to be the output bits directly connected to the input bits having indices included in the input bit index set B={$2^q$+q-bit bit reversal of 0, ... , (p−1)}={$2^q$+q-bit bit reversal of 0, $2^q$+q-bit bit reversal of 1, ... , $2^q$+q-bit bit reversal of (p−1)}. Each element of the index set B equals a sum of $2^q$ and one of a q-bit bit reversal of 0, ... , (p−1). For example, in the example of the first step, q=2 and p=2. Accordingly, the q-bit bit reversal of 0, ... , (p−1) is the 2-bit bit reversal of {00, 01}, or in the bit-reversed form, {00, 10}. Thus, the index set B equals {$2^2$+"00", $2^2$+"10"}={4, 6}, or {0100, 0110} in the n-bit binary form. Therefore, the input bits corresponding to the index set B are u4 and u6. By performing a 4-bit bit-reversal operation on the index set B, indices of the second portion of p to-be-punctured output bits can be determined to be {0010, 0110} corresponding to the output bits x2 and x6. At a third step, the input bits having indices included in the index set A∪B can be determined to be frozen bits.

Figure 7A:
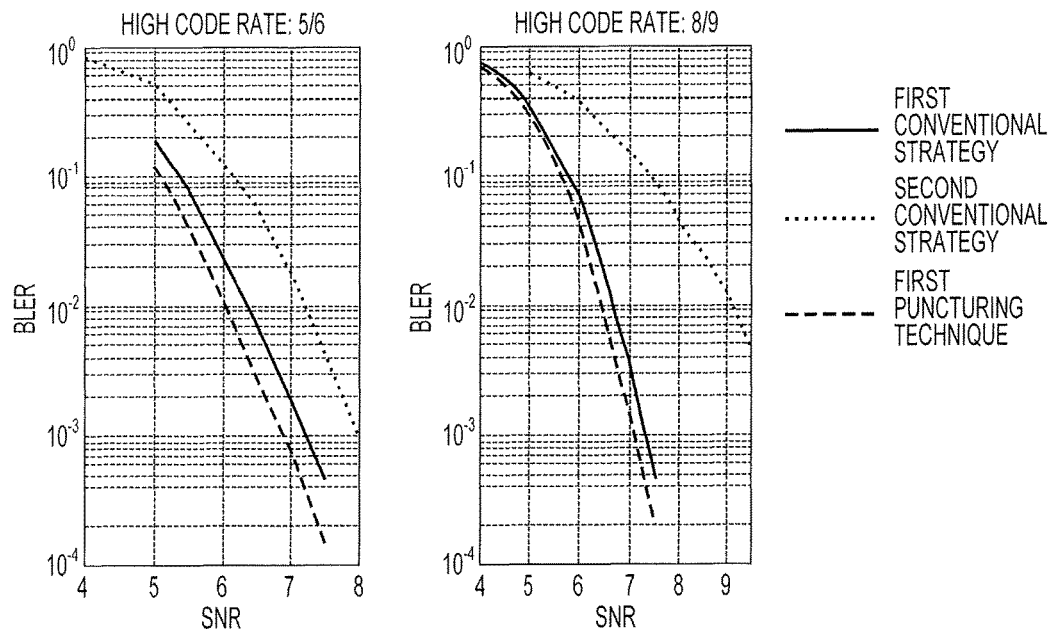
FIGS. 7A-7C show a comparison of block error rate (BLER) performance of different puncturing approaches resulted from a simulation experiment.
Figure 7B:
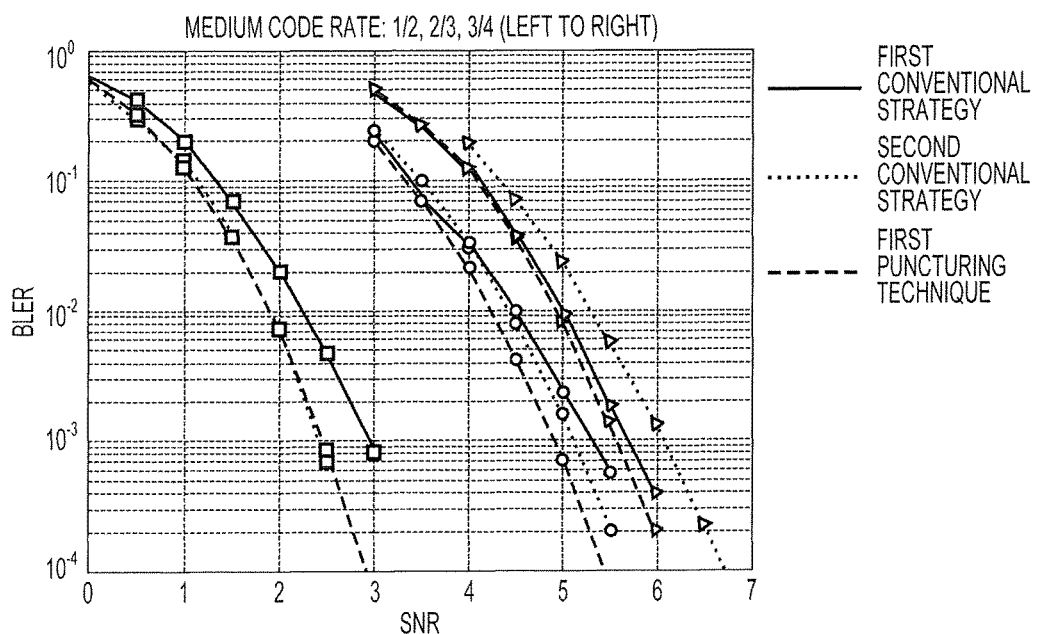
Figure 7C:
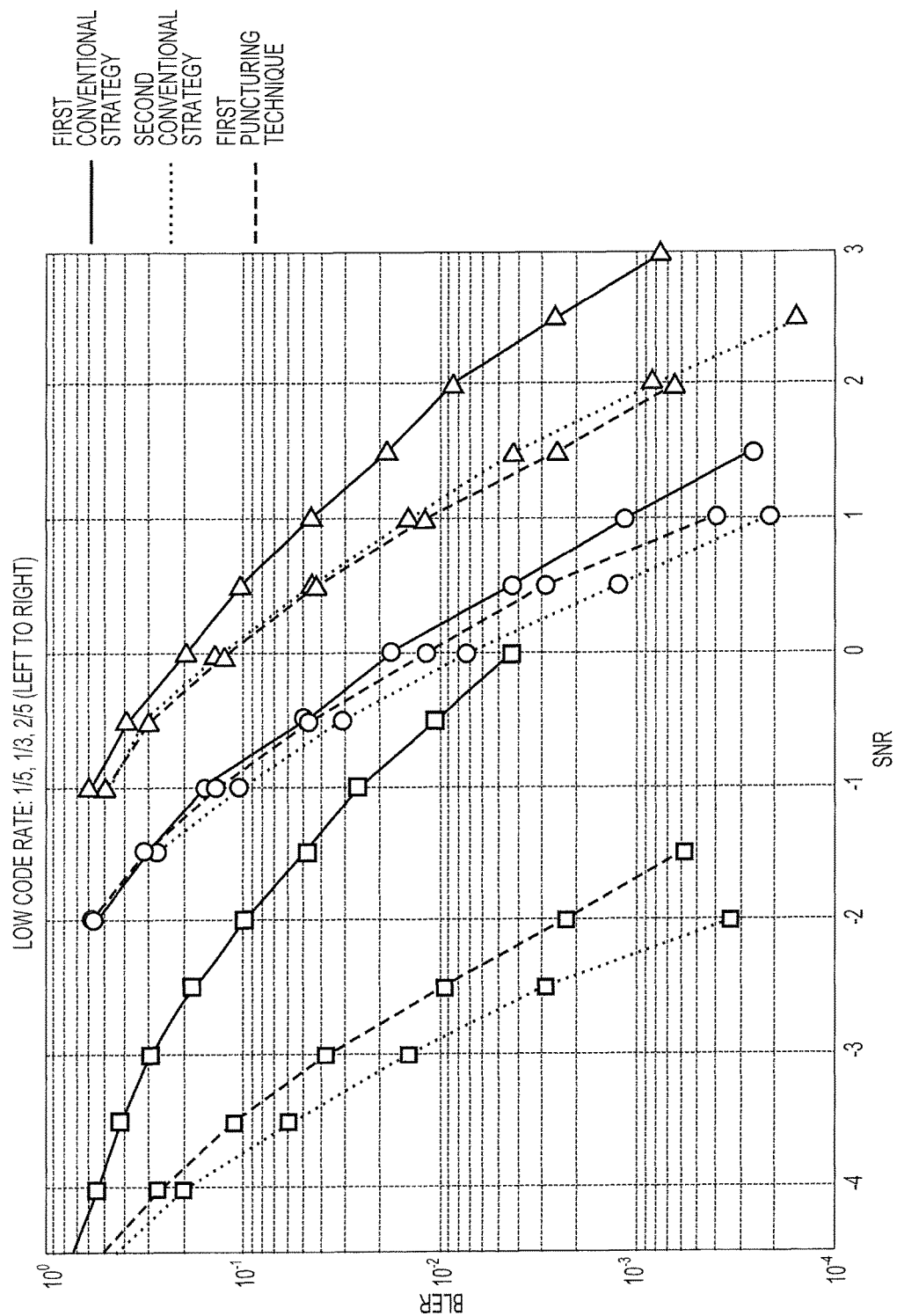

FIGS. 7A-7C show a comparison of block error rate (BLER) performance of different puncturing approaches resulted from a simulation experiment. Each vertical axis represents the BLER, and each horizontal axis represents SNR of a transmission channel for transmitting the punctured polar codes. In addition, solid lines represent performance of the first conventional puncturing strategy described with reference to FIG. 4. Dotted lines represent performance of the second conventional puncturing strategy described with reference to FIG. 5. Dashed lines represent performance of the first puncturing technique described with reference to FIG. 6.

FIG. 7A shows two diagrams at the right side and left side each corresponding to a high code rate, 5/6 and 8/9, respectively. As shown, the performance of the first technique (dashed line) is better than the conventional puncturing strategies for high code rate polar code encoding. FIG. 7B shows performance of the three methods at three different medium code rates, 1/2, 2/3, 3/4. As shown, the performance of the first technique (dashed line) is better than the conventional puncturing strategies for medium code rate polar code encoding. However, in FIG. 7C, where performance at three different low code rates, 1/5, 1/3, 2/5, is shown, the first technique (dashed line) demonstrates moderate performance compared with the conventional puncturing strategies.

Figure 8:
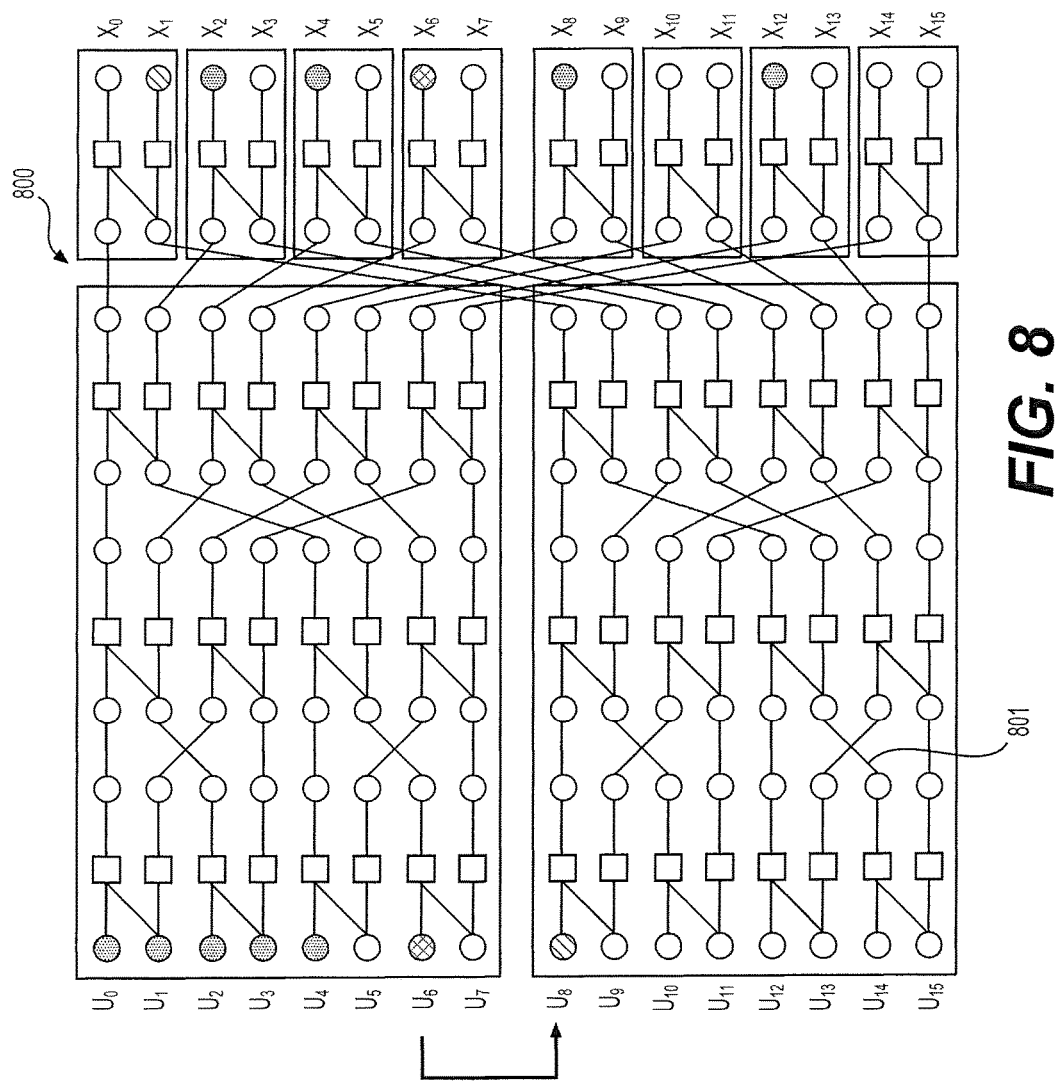
FIG. 8 shows a polar graph illustrating an example of a second polar code puncturing technique according to an embodiment of the disclosure.

FIG. 8 shows a polar graph 800 illustrating an example of a second polar code puncturing technique according to an embodiment of the disclosure. The polar graph 800 is the same as the polar graph 600. The second puncturing technique solves the low performance issue of the first puncturing technique shown in FIG. 7C when low code rate is employed. FIG. 8 shows the results of the example shown in FIG. 6 where N=16, n=4, and P=6, P=$2^2$+2, q=2, and p=2. As shown, the output bit x6 is punctured. However, as transmission of the output bit x6 assists transmission of the bit channel 801 connecting the output bit x7 and the input bit u14, puncturing x6 will degrade reliability of the bit channel 801. Consequently, error probabilities for decoding the good input bits u14 and u15 can be increased. During low code rate transmission, input bits close to the bottom of the polar graph are used as information bits. Accordingly, puncturing the output bit x6 can impact performance of low code rate transmission. To solve the problem, a position of a to-be-punctured input bit can be moved downward from the position of u6 to the position of u8. The to-be-punctured output bit corresponding to u8 is x1. Puncturing of x1 has no significant effect on good bits located close to the bottom of the polar graph 800.

Accordingly, a puncturing process implementing the second technique can include the following steps:

At a first step, the same operation as the first step of the first puncturing technique can be performed to determine a first portion of the to-be-punctured output bits. Using the same example as in FIG. 6 where six to-be-puncture output bits are to be determined, the input bits u0-u3 can be determined to be the to-be-punctured input bits, and accordingly the output bits x0, x4, x8, x12 are determined to be punctured.

At a second step, when the code rate is above a threshold, the original second step of the first technique can be maintained and performed; when the code rate is below the threshold, the to-be-punctured bits are determined to be the output bits directly connected to the input bits having indices included in an input bit index set, $$B' = \{2^q + (0, \ldots, p/2-1)\} \cup \{2^{n-1} + (0, \ldots, p/2-1)\}$$
$$= \{2^q + 0, 2^q + 1, \ldots, 2^q + (p/2-1)\} \cup \{2^{n-1} + 0, 2^{n-1} + 1, \ldots, 2^{n-1} + (p/2-1)\}.$$

The first part of the index set B', {$2^q$+0, $2^q$+1, ... , $2^q$+(p/2−1)}, includes p/2 number of input bits indices and corresponds to input bits adjacent to the to-be-punctured input bits u0-u3. The second part of the index set B', {$2^{n-1}$+0, $2^{n-1}$+1, ... , $2^{n-1}$+(p/2−1)}, includes the other p/2 number of input bits indices and corresponds to input bits starting from the input bit of index $2^{n-1}$ and going downwards. In various example, when p/2 is not an integer, a floor or ceiling function can be employed to map p/2 to a closest integer.

Figure 9:
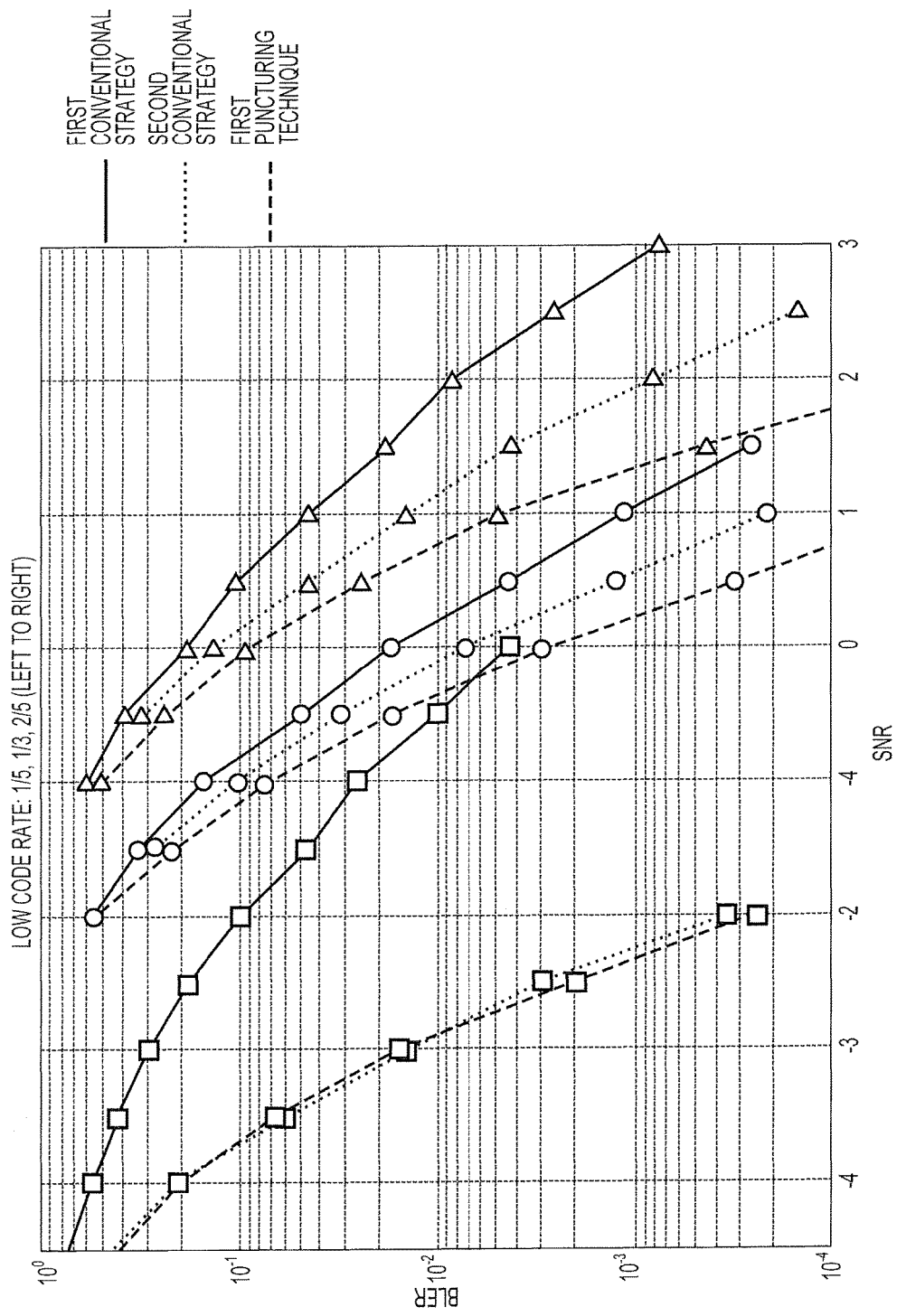
FIG. 9 shows a comparison of BLER performance of different puncturing approaches resulted from a simulation experiment.

FIG. 9 shows a comparison of BLER performance of different puncturing approaches resulted from a simulation experiment. FIG. 9 is similar to FIG. 7C where low code rate performance of the first and second conventional puncturing strategies is shown. However, the dashed lines represent performance of the second puncturing technique described with reference to FIG. 8. As shown, for low code rates, 1/5, 1/3, 2/5, the performance of the second puncturing technique has been improved being stronger than the first and second conventional puncturing strategies.

Figure 10:
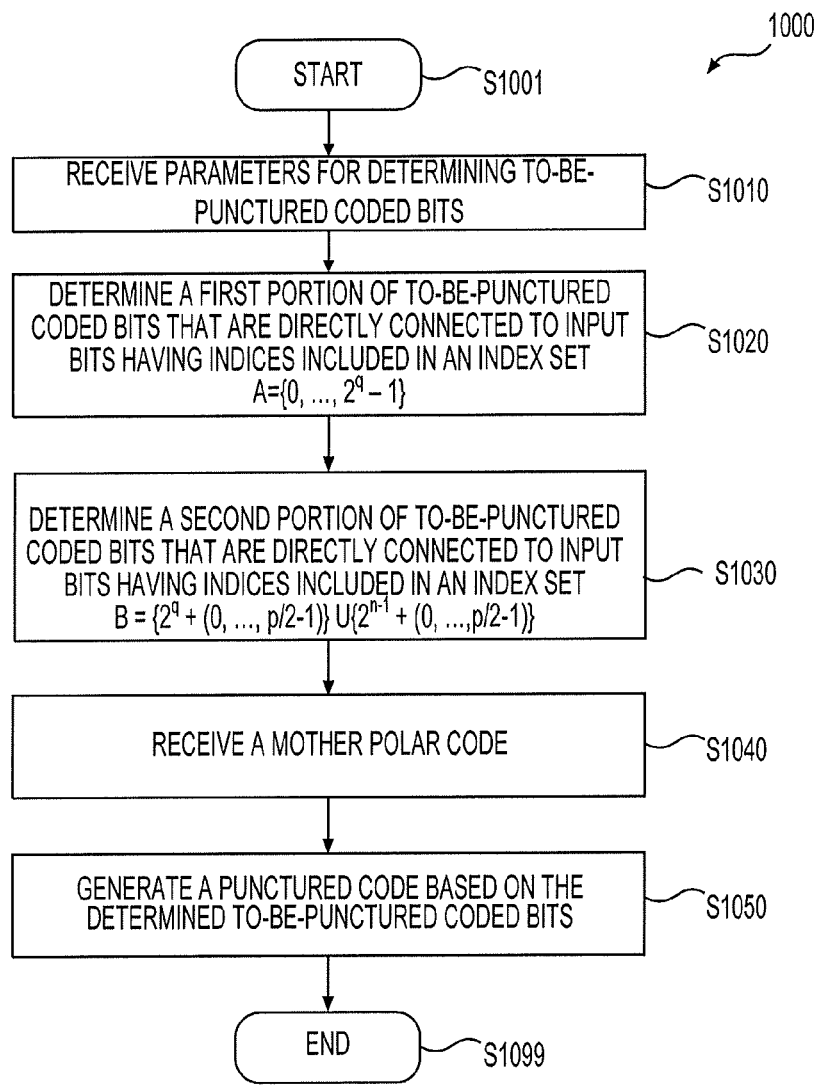
FIG. 10 shows a process for polar code puncturing according to an embodiment of the disclosure.

FIG. 10 shows a process 1000 for polar code puncturing according to an embodiment of the disclosure. The process 1000 can be performed by the channel encoder 240 in FIG. 2 example. The process 1000 starts from S1001, and proceeds to S1010.

At S1010, a set of parameters for determining to-be-punctured coded bits in a mother polar code can be received, for example, at the puncture controller 222 in FIG. 2. The parameters can include a mother code length N, and a punctured code length M. Accordingly, a to-be-punctured coded bits length can be derived to be P=N−M. The parameters can also include information of a generator matrix $G_N$ for generating mother polar codes. Based on the information of the generator matrix connection relationships via bit channels between input bits and output bits of the polar graph can be determined.

At S1020, a first portion of to-be-punctured coded bits is determined based the parameters, for example, by the puncture controller 222. In one example, the first portion of to-be-punctured coded bits is coded bits directly connected to input bits having the lowest indices. Specifically, the to-be-punctured coded bits length P can be represented in the form of $P=2^q+p$, where $q<=n-2$, and q is the largest exponent so that $0<=p<=2^q-1$. Accordingly, there is $2^q<=2^{n-2}=N/4$. With respect to the polar graph corresponding to the generator matrix $G_N$, the first portion of to-be-punctured coded bits can be determined to be the coded bits that are directly connected to input bits having indices included in an input bit index set $A=\{0, \ldots, 2^q-1\}$. Directly connection between an input bit and an output bit in the polar graph means the input bit and the output bit are connected via a virtual bit channel of the polar graph. For a generator matrix having a form of $G_N=B_N F^{\otimes r}$, an index of an output bit directly connected to an input bit can be obtained be bit-reversing a binary index of this input bit.

At S1030, a second portion of to-be-punctured coded bits can be determined for example, by the puncture controller 222. In one example, among the second portion of p to-be-punctured coded bits, p/2 to-be-punctured bits are coded bits directly connected to p/2 input bits that are distributed in a partition of input bits having indices starting from N/2. Specifically, with respect to the polar graph corresponding to the generator matrix $G_N$, the second portion of to-be-punctured coded bits can be determined to be the coded bits that are directly connected to input bits having indices included in an input bit index set $B=\{2^p+(0, \ldots, p/2-1)\} \cup \{2^{n-1}+(0, \ldots, p/2-1)\}=\{2^q+0, 2^q+1, \ldots, 2^q+(p/2-1)\} \cup \{2^{n-1}+0, 2^{n-1}+1, \ldots, 2^{n-1}+(p/2-1)\}$. Elements in the first part of the index set B, $\{2^q+(0, \ldots, p/2-1)\}$, are the input bits adjacent to the first portion of to-be-punctured coded bits determined at S1020. Elements in the second part of the index set B, $\{2^{n-1}+(0, \ldots, p/2-1)\}$, are the input bits starting from the input bit having an index of $2^{n-1}=N/2$ and going downward in the polar graph. In one example, the number of $2^q$ input bits equals N/4. Accordingly, the input bits of the first part of the index set B have indices in $\{N/4+(0, \ldots, p/2-1)\}$, while the input bits of the second part of the index set B have indices in $\{N/2+(0, \ldots, p/2-1)\}$. Accordingly, the $2^q$ input bits corresponding to the $2^q$ to-be-puncture output bits are included in the first one-fourth of the N input bits, while the input bits of the first and second parts of the index set B are distributed in the second and third one-fourth of the N input bits.

At S1040, a mother code with length N generated from a polar encoder can be received, for example, at the bit selector 224 in FIG. 2. For example, the mother code can be stored in a buffer.

At S1050, a punctured code can be generated based on results of determinations at S1020 and S1030. For example, position information can be received from the puncture controller 222. The position information can be in the form of a sequence of indices indicating the to-be-punctured bits. Alternatively, the position information can be in a form of a binary pattern vector using zeros and ones indicating positions to be punctured. Based on the position information, the bit selector 224 can exclude the un-punctured bits from the mother code to output a punctured code. The process 1000 proceeds to S1099, and terminates at S1099.

Figure 11C:
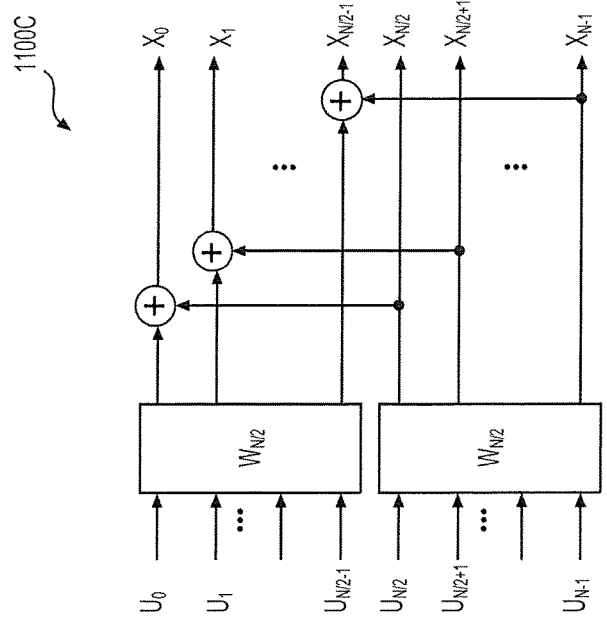
FIGS. 11A-11C show a recursive construction process for construction of a second type of polar graphs.
Figure 11A:
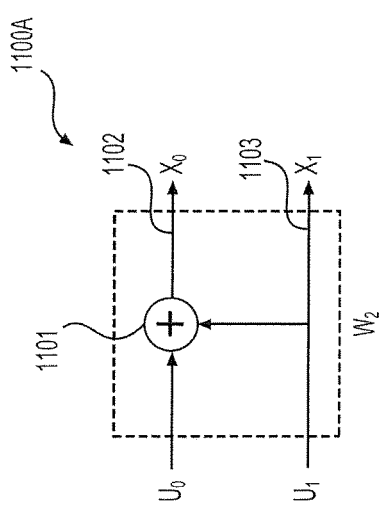
Figure 11B:
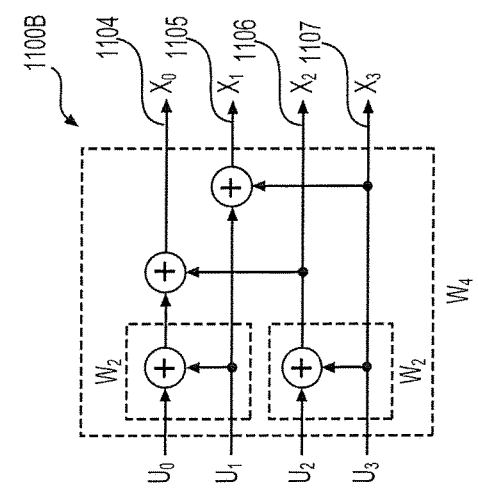

FIGS. 11A-11C show a recursive construction process for construction of a second type of polar graphs. As described above, FIGS. 3A-3C provide an example of constructing polar graphs based on generator matrices in the form of $G_N=B_N F^{\otimes r}$. Such type of polar graphs is referred to as a first type of polar graphs, and the type of the generator matrices of $G_N=B_N F^{\otimes r}$ is referred to as a first type of generator matrices. In contrast, the second type of polar graphs can be based on a second type of generator matrices. The second type of matrices can take a form of $G_N=F^{\otimes n}$, where $N=2^n$, and the bit-reversal permutation matrix $B_N$ is not employed.

FIG. 11A shows a basis polar graph 1100A corresponding to a generator matrix of $G_2=F^{\otimes 1}$. The structure of the polar graph 1100A is similar to the polar graph 300A in FIG. 3A. The element 1101 represents a modulo-2 addition of two input bits u0-u1. Two virtual bit channels 1102 and 1103 are formed between two pairs of input bits and output bits: one between u0 and x0, and the other between u1 and x1. The two bit channels 1102-1103 are included in a combined channel W2. The combined channel W2 combines two usages of a transmission channel for transmitting x0 and x1 independently.

FIG. 11B shows a polar graph 1100B corresponding to a generator matrix of $G_4=F^{\otimes 2}$. As shown, the polar graph 1100B is constructed based on the polar graph 1100A. Two W2 channels are further combined to form a W4 combined channel. Four bit channels 1104-1107 are formed. Different from the example of FIGS. 3A-3C, the bit channels in FIG. 11B are positioned horizontally. Accordingly, indices of an input bit and an output bit connected by a bit channel in the polar graph are the same. FIG. 11C shows how a N-dimensional polar graph 1100C can be constructed based on combined channels of $W_{N/2}$.

The second type of polar graphs and generator matrices is equivalent to the first type of polar graphs and generator matrices in terms of property of polar codes generated respectively. The difference between the two types of coding manners is that for a same set of input bits, two sequences of output bits generated by the two types of encodings are arranged in a different order. Specifically, performing a bit-reversal permutation operation to one output sequence results in the other output sequence.

Accordingly, the polar code puncturing techniques described with reference to the first type of polar graphs are also applicable to polar graphs of the second type. For example, in the first and second puncturing techniques, to-be-punctured coded bits are determined with reference to indices of input bits that are directly connected to the to-be-punctured coded bits. However, reasoning for selection of those input bits is independent of what types of polar graphs are employed. Thus, using input bit indices to describe puncturing selections is a universal way over the two types of polar graphs. Specifically, for the second type of polar graphs, corresponding to an input bit, an output bit, which is directly connected to the input bit, is connected to the input bit by a horizontal line indicating a bit channel. Accordingly, an index of the output bit is the same as that of the respective input pit. Therefore, the first and second polar code puncturing techniques are applicable for both the first and second type of polar graphs and generator matrices.

Accordingly, at S1010 of the process 1000, information of the generator matrix can include type information of the generator matrix. Based on the type of the generator matrix, indices of to-be-puncture output bits can be obtained. For example, for a first type generator matrix having a form of $G_N=B_N F^{\otimes r}$, to-be-punctured output bits indices can be obtained by bit-reversing indices of respective input bits directly connected to the to-be-punctured output bits. In contrast, for a second type generator matrix having a form of $G_N=F^{\otimes r}$, to-be-punctured output bits indices are the same as that of input bits directly connected to the to-be-punctured output bits. Alternatively, in one example, the rate matching module 220 in FIG. 2 can include a bit reversal module disposed between the polar encoder 210 and the bit selector 224. When the polar encoder 210 operates based on a first type generator matrix having a form of $G_N=B_N F^{\otimes n}$, the bit reversal module can be employed to perform a bit reversal permutation to the output bits of the polar encoder 210. As a result, the permuted output bits is re-ordered to be the same as output bits generated from a generator matrix of $G_N=F^{\otimes r}$. Subsequently, to-be-punctured output bits indices can be obtained in a way the same as output bits generated from the a generator matrix of $G_N=F^{\otimes r}$.

Figure 12:
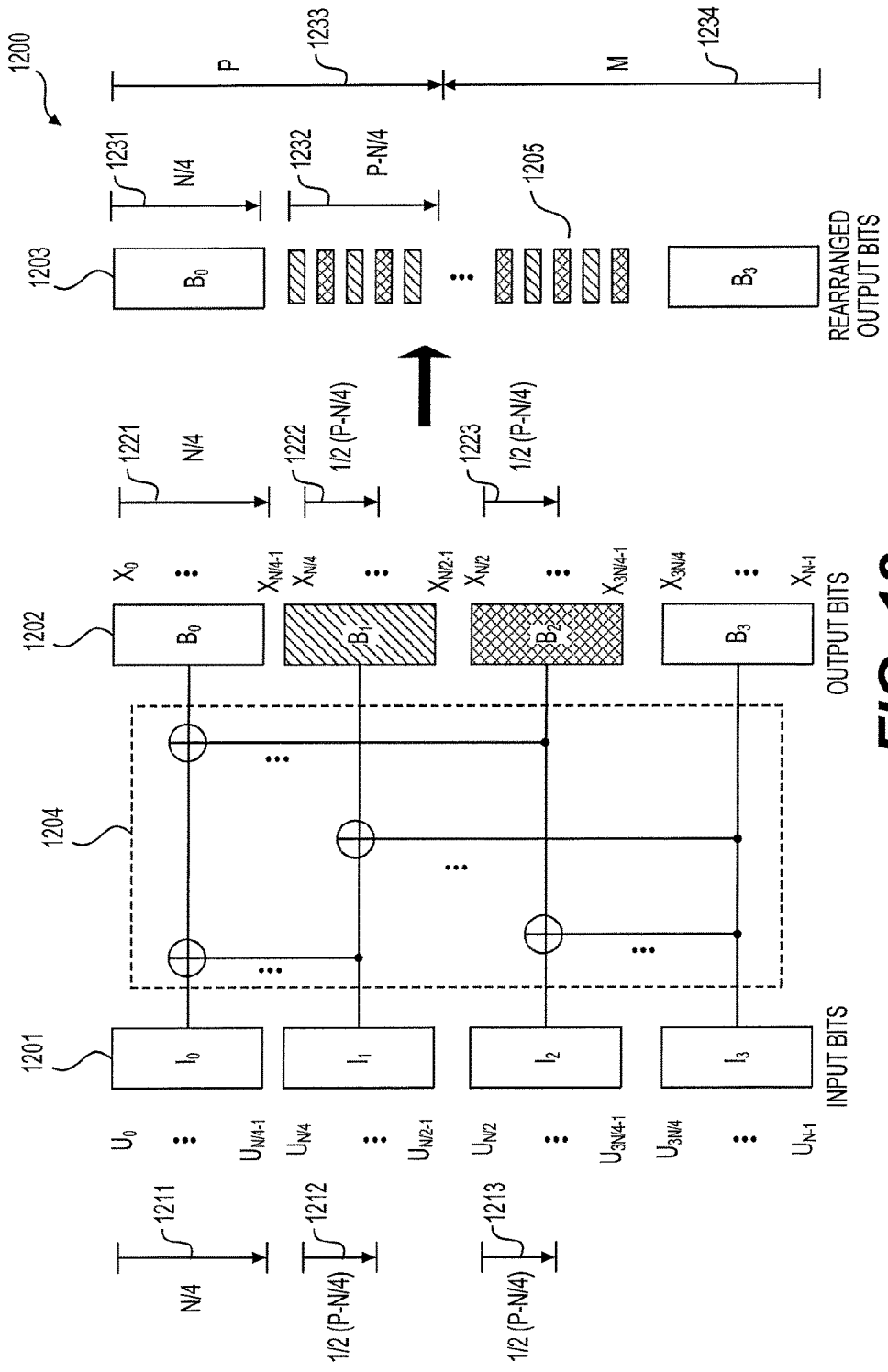
FIG. 12 illustrates a polar code puncturing process according to an embodiment of the disclosure.

FIG. 12 illustrates a polar code puncturing process 1200 according to an embodiment of the disclosure. The process 1200 provides a basis for deriving a third polar code puncturing technique. The process 1200 is based on a polar graph 1204 corresponding to a generator matrix $G_N=F^{\otimes r}$ of the second type. Mother polar code generated based on the polar graph 1204 has a length of N. In the process 1200, a to-be-generated punctured code has a length of M, and to-be-punctured coded bits have a length of $P=2^q+p$. As shown, input bits 1201 having indices $\{0, \ldots, N-1\}$ are equally partitioned into four input blocks I0-I3. Output bits 1202 having indices $\{0, \ldots, N-1\}$ are also equally partitioned into four output blocks B0-B3.

The process 1200 corresponds to a special case of the process 1000 in FIG. 10. Specifically, for a low code rate scenario, as determined at S1020 and S1030, the to-be-punctured input bits includes a first portion of the index set $A=\{0, \ldots, 2^q-1\}$ and a second portion of the index set $B=\{2^q+(0, \ldots, p/2-1)\} \cup \{2^{n-1}+(0, \ldots, p/2-1)\}$. The first portion of the index A includes $2^q$ number of input bits while the second portion of the index B includes p umber of input bits. For the index set B, the first and second part of the index set B can be represented by two index sets H1 and H2. Thus, $H1=\{2^q+(0, \ldots, p/2-1)\}$, and $H2=\{2^{n-1}+(0, \ldots, p/2-1)\}$.

In FIG. 12, when the number ($2^q$) of the first portion input bits 1211 of the index set A equals N/4 (meaning $P=2^q+q=N/4+q$), the remaining second portion input bits of the index set B can be equally distributed in the input blocks I1 and I2: input bits 1212 of the index set H1 are located in the input block I1, while input bits 1213 of the index set H2 are located in the input block I2. This scenario is a special case of the process 1000. Accordingly, to-be-punctured output bits can be determined. Because the polar graph 1204 is of the second type, indices of the to-be-punctured output bits are the same as the to-be-punctured input bits. As shown, a first portion of to-be-puncture output bits 1221 and a second portion of to-be-punctured output bits 1222 and 1223 can be determined.

Further, corresponding to the above determination process where the first portion of to-be-punctured input bits correspond to the first input block I0, a rearrangement operation can be employed in order to facilitate extraction of the to-be-punctured output bits 1221, 1222, and 1223. Specifically, the output bits 1202 are rearranged into the rearranged output bits 1203. As shown, the output bits 1222-1223 in the output blocks B1 and B2 are interleaved with each other at the rearranged output bits 1203. Consequently, output bits in the two parts of to-be-punctured output bits 1222 and 1223 become contiguous to each other in an interleaved way forming a block of to-be-punctured coded bits 1232. Thus, a consecutive range 1233 having a length of P including the block B0 1231 and the block 1232 can be formed. The consecutive range 1233 includes the to-be-punctured output bits. As a result, in one example, when the rearranged output bits 1203 are stored in a memory, an extraction of output bits to form a punctured code becomes reading a consecutive range 1234 of output bits from the memory, leading to a simplified extraction operation.

Based on the above process 1200, the third polar code puncturing technique can be derived. Specifically, in one example of the third puncturing technique, when the number of to-be-punctured output bits, P, is smaller than the size of block B0 in the rearranged output bits 1203, the first P number of output bits in block B0 is punctured. In contrast, when the number of to-be-punctured output bits, P, is greater than the size of block B0, the first P number of output bits in the rearranged output bits 1203 can be punctured. Thus, the arrangement of output bits as shown at 1203 in FIG. 12 enables a unified and simplified extraction of output bits for generation of a punctured code: extract the last M output bits 1234 from the rearranged output bits 1203 to generate the punctured code.

Figure 13:
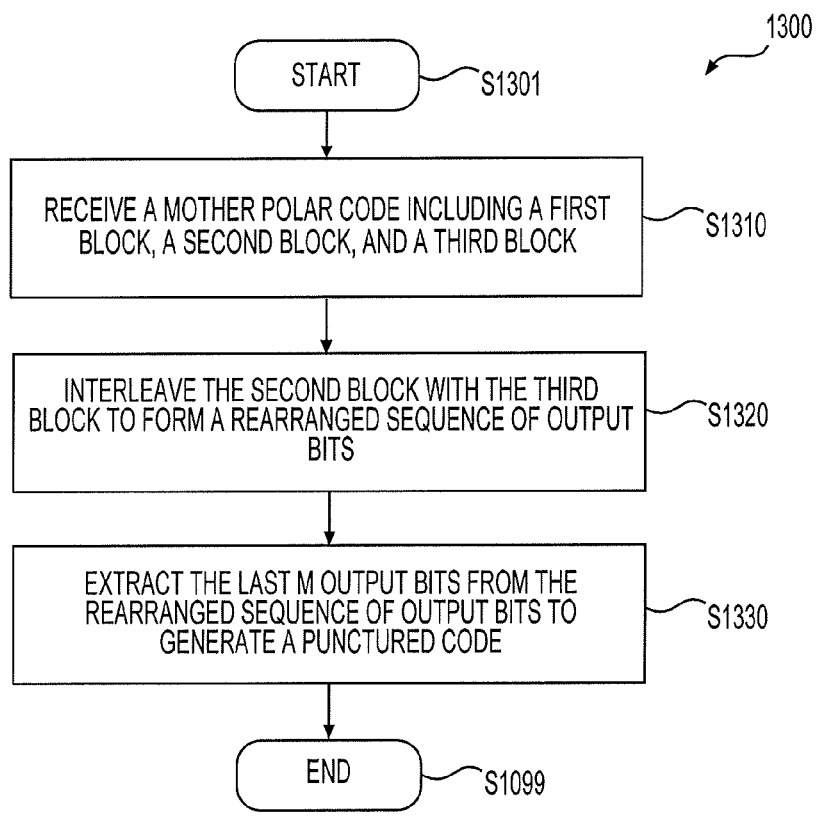
FIG. 13 shows an example process implementing the third polar code puncturing technique according to an example of the disclosure.

FIG. 13 shows an example process 1300 implementing the third polar code puncturing technique according to an example of the disclosure. The process 1300 starts from S1301 and proceeds to S1310.

At S1310, a mother polar code is received. The mother code can be generated from a polar encoder based on a generator matrix $G_N=F^{\otimes r}$ of the second type. Alternatively, for a polar code generated from a first type generator matrix having a form of $G_N=B_N F^{\otimes r}$, a bit-reversal permutation can be performed to transform the polar code of the first type to the received mother code of the second type. The received mother code can include a sequence of coded bits. The sequence of coded bits can have indices in an index set $\{0, \ldots, N-1\}$. In addition, the sequence of coded bits can include at least a first block having indices $\{0, \ldots, i-1\}$, a second block having indices $\{i, i+k-1\}$, a third block having indices $\{i+k, i+k+k-1\}$. The second and third block both have a length of k.

At S1320, the second and third blocks are interleaved with each other to form a rearranged sequence of coded bits. For example, the rearranged sequence can be stored in a buffer.

At S1330, the last M coded bits are extracted from the rearranged sequence of coded bits to generate a punctured code having a length of M. For example, the last M coded bits can read from the buffer. The process 1300 proceeds to S1399 and terminates at S1399.

Figure 14:
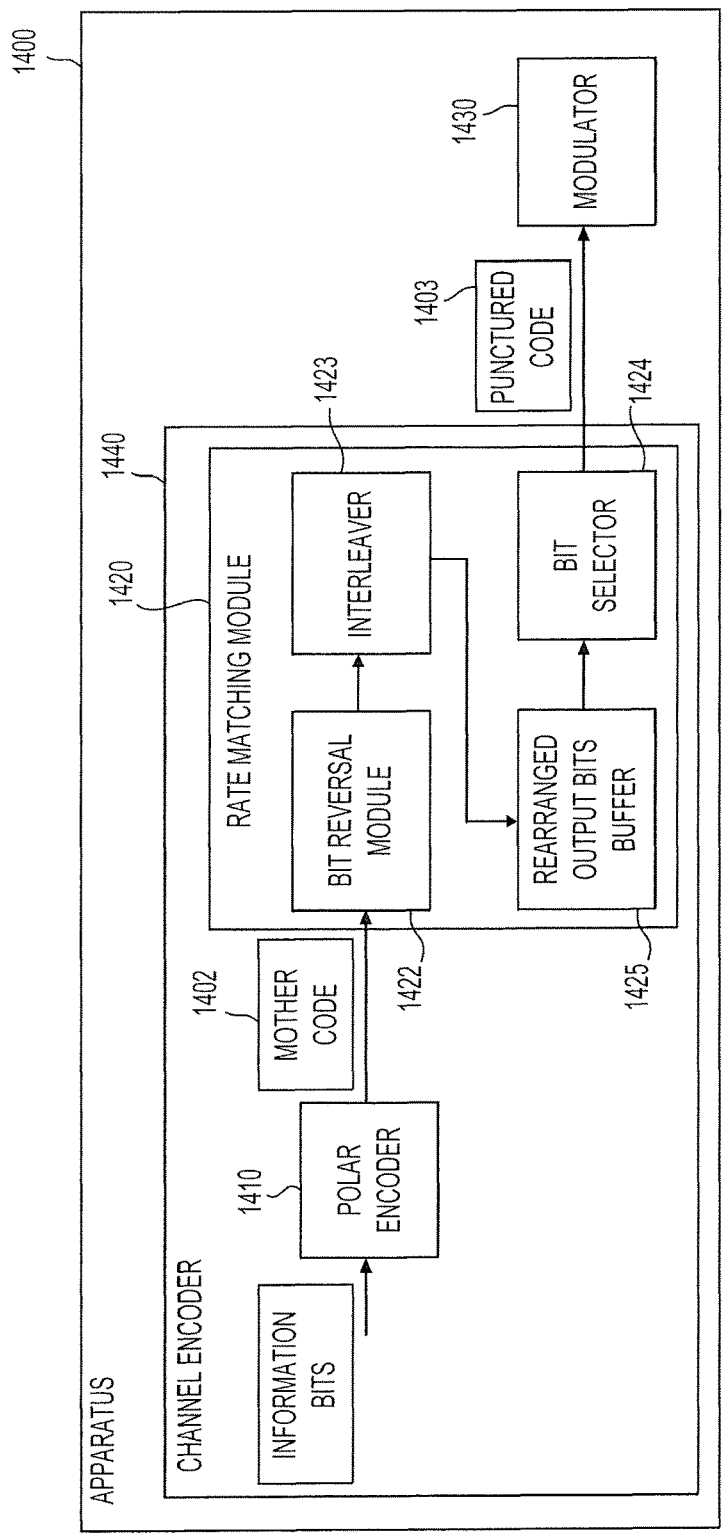
FIG. 14 shows an apparatus for polar code matching according to an embodiment of the disclosure.

FIG. 14 shows an apparatus 1400 for polar code matching according to an embodiment of the disclosure. The apparatus 1400 implements the third polar code puncturing technique. The apparatus 1400 includes a channel encoder 1440 and a modulator 1430. The channel encoder 1440 includes a polar encoder 1410 and a rate matching module 1420. Those components are coupled together as shown in FIG. 14. The apparatus 1400 has structures and functionality similar to the apparatus 200 in FIG. 2. The components 1440, 1410, and 1430 in FIG. 14 are similar to the counterparts 240, 210, and 230 in FIG. 2 in terms of structures and functions. However, the rate matching module 1420 is different from the rate matching module 220.

Specifically, the rate matching module 1420 can include a bit-reversal module 1422, an inter-leaver 1423, a rearranged output bits buffer 1425 and a bit selector 1424. The rate matching module 1420 is configured to receive a mother code 1402 of length N and accordingly generate a punctured code 1403 of length M. The bit-reversal module 1422 is configured to perform a bit-reversal permutation on the received mother code 1402 to generate a reordered mother code when the received mother code 1402 is generated based on a polar graph of the first type. The inter-leaver 1423 is configured to interleave two blocks of coded bits in the mother code 1402 or the reordered mother code to generate a sequence of rearranged output bits. The rearranged output bits buffer 1425 is configured to store the rearranged output bits corresponding. The bit selector 1424 is configured to exclude un-punctured output bits from the rearranged output bits buffer 1425 to generate the punctured code 1403.

In operation, the polar encoder 1410 performs polar encoding. In one example, the polar encoding is based on a first type of generator matrix having a form of $G_N=B_N F^{\otimes r}$. Accordingly, the bit-reversed module 1422 can receive the mother code 1402 of the first type, and perform a bit-reversal permutation operation to reorder the mother code 1402. Alternatively, in another example, when the polar encoder 1410 performs polar encoding based on a second type of generator matrix having a form of $G_N=F^{\otimes r}$, no bit-reversal permutation operation is performed to the mother code 1402.

Subsequently, the inter-leaver 1423 can perform an interleaving operation. For example, the original mother code 1402 or the reordered mother code can include a sequence of output bits. The sequence of output bits can include at least a first, second and third successive blocks. The first block can include the first A number of output bits in the sequence. The second and third blocks can have a same length and each include B number of output bits in the sequence. Accordingly, the rate matching module 1420 can interleave the second and third blocks. As a result, a rearranged sequence can be created and stored into the rearranged output bits buffer 1425. The bit selector 1424 can subsequently read the last M number of output bits from the rearranged output bits buffer 1425 and output the M number of output bits as the punctured code 1403.

In various embodiments, the channel encoder 240 and 1440 in FIG. 2 or 14 can be implemented with hardware, software, or combination thereof. For example, the channel encoder 240 or 1440 can be implemented with one or more integrated circuits (ICs), such as an application specific integrated circuit (ASIC), field programmable gate array (FPGA), and the like. For another example, the channel encoder 240 or 1440 can be implemented as software or firmware including instructions stored in a computer readable non-volatile storage media. The instructions, when executed by a processing circuit, causing the processing circuit to perform functions of the channel encoder 240 and 1440.

While the rate matching module 1420 in FIG. 14 example employs a puncturing scheme to realize rate matching functionality, in other examples, the rate matching module 1420 can employ more than one rate matching schemes to optimize its rate matching performance. For example, the rate matching module 1420 can select one rate matching scheme from multiple rate matching schemes, such as puncturing, shortening, repetition, and the like. The selection can be based on some conditions, such as whether mother code rate, defined as a ratio of information bits length to a polar code length, is larger than a threshold, whether the mother code length is larger than a code length required by a transmission resource allocation, and the like. Corresponding to different scenarios, different rate matching schemes can be selected to achieve an optimal rate matching performance.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A method for polar code puncturing in a wireless communication system, comprising:
   receiving information bits;
   encoding the information bits to generate a first polar code including a sequence of N coded bits, the sequence of N coded bits having indices $\{0, \ldots, N-1\}$ and including at least a first block of coded bits having indices $\{0, \ldots, i-1\}$, a second block of coded bits having indices $\{i, \ldots, i+k-1\}$, a third block of coded bits having indices $\{i+k, \ldots, i+k+k-1\}$;
   interleaving the second block of coded bits with the third block of coded bits to form a rearranged sequence of coded bits including the N coded bits;
   extracting the last M coded bits from the rearranged sequence of coded bits to generate a punctured code having a length of M, wherein M is a code length determined according to allocated transmission resources; and
   generating a signal modulated by the punctured code.

2. The method of claim 1, wherein i=N/4, and i+k=N/2.

3. The method of claim 1, wherein the first polar code is generated based on a generator matrix $G_N$ having a form of $G_N=F^{\otimes r}$, where $F^{\otimes r}$ denotes an n-th Kronecker product of a basis matrix $$F = \begin{bmatrix} 1 & 0 \\ 1 & 1 \end{bmatrix}.$$

4. The method of claim 1, further comprising:
   receiving a second polar code generated based on a generator matrix $G_N$ having a form of $G_N=B_N F^{\otimes r}$, wherein $B_N$ denotes a bit-reversal permutation matrix, and $F^{\otimes r}$ denotes an n-th Kronecker product of a basis matrix $$F = \begin{bmatrix} 1 & 0 \\ 1 & 1 \end{bmatrix};$$

and
   performing a bit-reversal permutation to the received second polar code to generate the first polar code.

5. The method of claim 1, further comprising:
   storing the rearranged sequence of coded bits in a buffer, wherein extracting the last M coded bits from the rearranged sequence of coded bits includes reading the last M coded bits of the rearranged sequence of coded bits from the buffer.

6. An apparatus for polar code puncturing, comprising:
   an encoding circuit configured to,
     receive information bits, and
     encode the information bits to generate a first polar code including a sequence of N coded bits, the sequence of N coded bits having indices $\{0, \ldots, N-1\}$ and including at least a first block of coded bits having indices $\{0, \ldots, i-1\}$, a second block of coded bits having indices $\{i, \ldots, i+k-1\}$, a third block of coded bits having indices $\{i+k, \ldots, i+k+k-1\}$;

an interleaving circuit configured to,
   receive the first polar code, and
   interleave the second block of coded bits with the third block of coded bits to form a rearranged sequence of coded bits including the N coded bits;
a bit selector circuit configured to extract the last M coded bits from the rearranged sequence of coded bits to generate a punctured code having a length of M, wherein M is a code length determined according to allocated transmission resources; and
a transmission circuit configured to generate a signal modulated by the punctured code.

7. The apparatus of claim 6, wherein i=N/4, and i+k=N/2.

8. The apparatus of claim 6, wherein the first polar code is generated based on a generator matrix $G_N$ having a form of $G_N = F^{\otimes r}$, where $F^{\otimes r}$ denotes an n-th Kronecker product of a basis matrix $$F = \begin{bmatrix} 1 & 0 \\ 1 & 1 \end{bmatrix}.$$

9. The apparatus of claim 6, further comprising a bit-reversal circuit configured to:
   receive a second polar code generated based on a generator matrix $G_N$ having a form of $G_N = B_N F^{\otimes r}$, wherein $B_N$ denotes a bit-reversal permutation matrix, and $F^{\otimes r}$ denotes an n-th Kronecker product of a basis matrix $$F = \begin{bmatrix} 1 & 0 \\ 1 & 1 \end{bmatrix};$$

and
   perform a bit-reversal permutation to the received second polar code to generate the first polar code.

10. The apparatus of claim 6, further comprising a rearranged coded bits buffer configured to store the rearranged sequence of coded bits, wherein the bit selector is configured to read the last M coded bits from the buffer.

11. A method for polar code puncturing in a wireless communication system, comprising:
   determining positions of P number of to-be-punctured coded bits that are to be punctured from a polar code including a sequence of coded bits generated from a polar encoder that encodes a sequence of input bits having indices {0, . . . , N−1} to generate the polar code according to a polar graph, wherein the polar code has a length of N, and N is 2 to the n-th power,
   wherein $P=2^q+p$, $q \leq n-2$, q is the largest exponent so that $0 \leq p \leq 2^q-1$, and,
   wherein a first portion of the P number of to-be-punctured coded bits includes coded bits in the polar graph that are connected, via bit channels, to input bits having indices included in an index set $A=\{0, \ldots, 2^q-1\}$;
   receiving the polar code;
   generating a punctured code, according to the determined positions of the P number of to-be-punctured coded bits, the punctured code including the sequence of coded bits excluding the P number of to-be-punctured coded bits, and having a code length matching a code length determined according to allocated transmission resources; and
   generating a signal modulated by the punctured code.

12. The method of claim 11, wherein a second portion of the P number of to-be-punctured coded bits includes coded bits in the polar graph directly connected to input bits having indices included in an index set, $B1=\{2^q+0, 2^q+1, \ldots, 2^q+(p/2-1)\} \cup \{2^{n-1}+0, 2^{n-1}+1, \ldots, 2^{n-1}+(p/2-1)\}$.

13. The method of claim 11, wherein a second portion of the P number of to-be-punctured coded bits includes coded bits in the polar graph directly connected to input bits having indices included in an index set, $B2=\{2^q+q\text{-bit bit reversal of } 0, 2^q+q\text{-bit bit reversal of } 1, \ldots, 2^q+_q\text{-bit bit reversal of } (p-1)\}$.

14. The method of claim 11, further comprising:
   when a code rate equal to a ratio of information bits length to punctured code length is smaller than a threshold, determining a second portion of the P number of to-be-punctured coded bits to be coded bits in the polar graph directly connected to input bits having indices included in an index set, $B1=\{2^q+0, 2^q+1, \ldots, 2^q+(p/2-1)\} \cup \{2^{n-1}+0, 2^{n-1}+1, \ldots, 2^{n-1}+(p/2-1)\}$.

15. The method of claim 14, further comprising:
   when the code rate is greater than the threshold, determining the second portion of the P number of to-be-punctured coded bits to be coded bits in the polar graph directly connected to input bits having indices included in an index set, $B2=\{2^q+q\text{-bit bit reversal of } 0, 2^q+q\text{-bit bit reversal of } 1, \ldots, 2^q+q\text{-bit bit reversal of } (p-1)\}$.

16. An apparatus for polar code puncturing, comprising:
   a puncture controller circuit configured to,
      determine positions of P number of to-be-punctured coded bits that are to be punctured from a polar code including a sequence of coded bits generated from a polar encoder that encodes a sequence of input bits having indices {0, . . . , N−1} to generate the polar code according to a polar graph, wherein the polar code has a length of N, and N is 2 to the n-th power,
      wherein $P=2^q+p$, $q \leq n-2$, q is the largest exponent so that $0 \leq p \leq 2^q-1$, and,
      wherein a first portion of the P number of to-be-punctured coded bits includes coded bits in the polar graph that are connected, via bit channels, to input bits having indices included in an index set $A=\{0, \ldots, 2^q-1\}$;
   a bit selector circuit configured to,
      receive the polar code, and
      generate a punctured code according to the determined positions of the P number of to-be-punctured code, the punctured code including the sequence of coded bits excluding the P number of to-be-punctured coded bits, and having a code length matching a code length determined according to allocated transmission resources; and
   a transmission circuit configured to generate a signal modulated by the punctured code.

17. The apparatus of claim 16, wherein a second portion of the P number of to-be-punctured coded bits includes coded bits in the polar graph directly connected to input bits having indices included in an index set, $B1=\{2^q+0, 2^q+1, \ldots, 2^q+(p/2-1)\} \cup \{2^{n-1}+0, 2^{n-1}+1, \ldots, 2^{n-1}+(p/2-1)\}$.

18. The apparatus of claim 16, wherein a second portion of the P number of to-be-punctured coded bits includes coded bits in the polar graph directly connected to input bits having indices included in an index set, $B2=\{2^q+q\text{-bit bit reversal of } 0, 2^q+q\text{-bit bit reversal of } 1, \ldots, 2^q+q\text{-bit bit reversal of } (p-1)\}$.

19. The apparatus of claim 16, wherein the puncture controller circuit is further configured to:

when a code rate equal to a ratio of information bits length to punctured code length is smaller than a threshold, determine a second portion of the P number of to-be-punctured coded bits to be coded bits in the polar graph directly connected to input bits having indices included in an index set, $B1=\{2^q+0, 2^q+1, \ldots, 2^q+(p/2-1)\} \cup \{2^{n-1}+0, 2^{n-1}+1, \ldots, 2^{n-1}+(p/2-1)\}$.

20. The apparatus of claim 19, wherein the puncture controller circuit is further configured to:

when the code rate is greater than the threshold, determine the second portion of the P number of to-be-punctured coded bits to be coded bits in the polar graph directly connected to input bits having indices included in an index set, $B2=\{2^q+\text{q-bit bit reversal of } 0, 2^q+\text{q-bit bit reversal of } 1, \ldots, 2^q+\text{q-bit bit reversal of } (p-1)\}$.

* * * * *